(12) United States Patent
Wu

(10) Patent No.: US 7,781,838 B2
(45) Date of Patent: Aug. 24, 2010

(54) INTEGRATED CIRCUIT INCLUDING A BODY TRANSISTOR AND METHOD

(75) Inventor: Dongping Wu, Dresden (DE)

(73) Assignee: Qimonda AG, Munich (DE)

( * ) Notice: Subject to any disclaimer, the term of this patent is extended or adjusted under 35 U.S.C. 154(b) by 236 days.

(21) Appl. No.: 12/106,456

(22) Filed: Apr. 21, 2008

(65) Prior Publication Data

US 2009/0261411 A1 Oct. 22, 2009

(51) Int. Cl.
*H01L 27/01* (2006.01)
(52) U.S. Cl. .................. 257/349; 257/305; 257/376; 257/395; 257/E29.016; 257/E21.545; 438/296
(58) Field of Classification Search ............... 257/349, 257/305, 347, 376, 395, E29.016, E21.545; 438/296
See application file for complete search history.

(56) References Cited

U.S. PATENT DOCUMENTS

| 5,273,921 | A | * | 12/1993 | Neudeck et al. ............ 438/157 |
| 6,100,159 | A | | 8/2000 | Krivokapic |
| 6,913,964 | B2 | | 7/2005 | Hsu |
| 2003/0102499 | A1 | * | 6/2003 | Fujiwara ..................... 257/288 |
| 2005/0280052 | A1 | | 12/2005 | Holz et al. |
| 2008/0285357 | A1 | * | 11/2008 | Kang .................... 365/189.09 |

OTHER PUBLICATIONS

"Quasi-SOI MOSFETs—a Promising Bulk Device Candidate for Extremely Scaled Era", Yu Tian, et al., IEEE Trans. on electr. dev., vol. 54, No. 7, Jul. 2007.

* cited by examiner

*Primary Examiner*—Tu-Tu V Ho
(74) *Attorney, Agent, or Firm*—Dicke, Billig & Czaja, PLLC

(57) ABSTRACT

An integrated circuit including a floating body transistor and method. One embodiment provides a transistor including a body region formed in a first portion and a first and a second source/drain region formed in a second and a third portion. The body region is formed in a semiconductor substrate. The integrated circuit further includes a buried structure disposed at least below the body region and a first and a second insulating structure including an insulating material and being disposed at least between the body region and regions of the second and the third portion below the first and the second source drain region, wherein the first and the second insulating structure contact the buried structure.

12 Claims, 21 Drawing Sheets

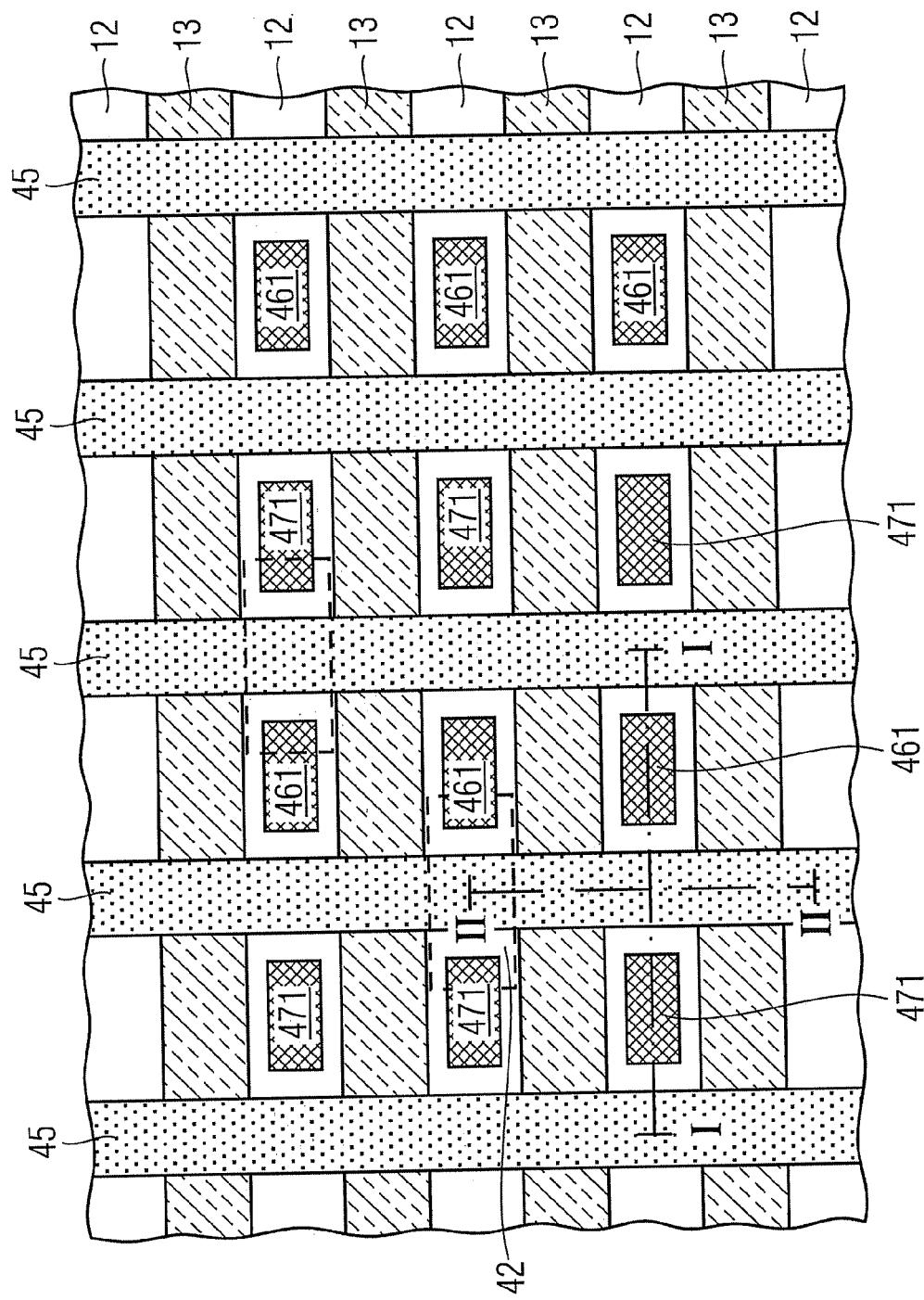

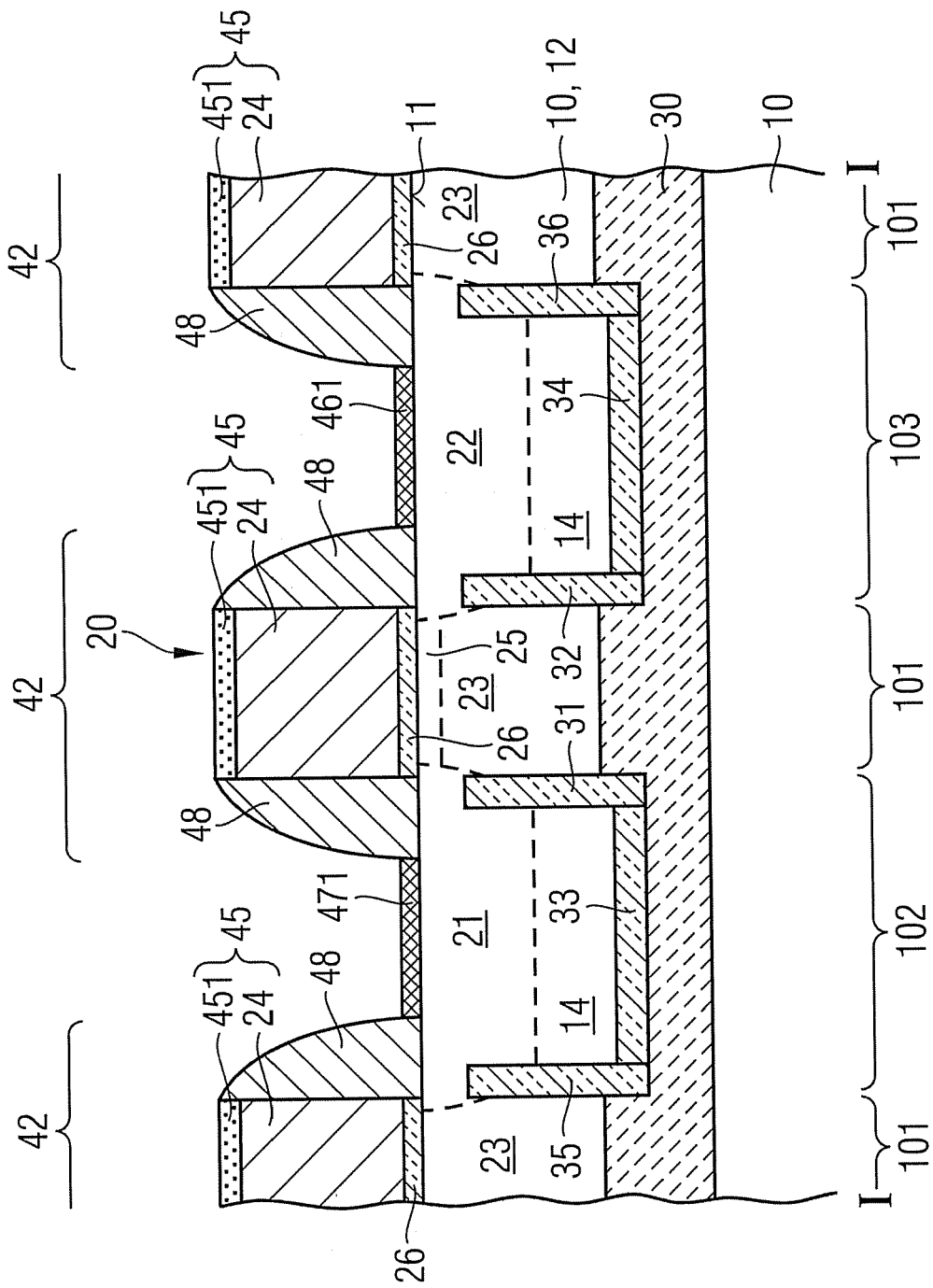

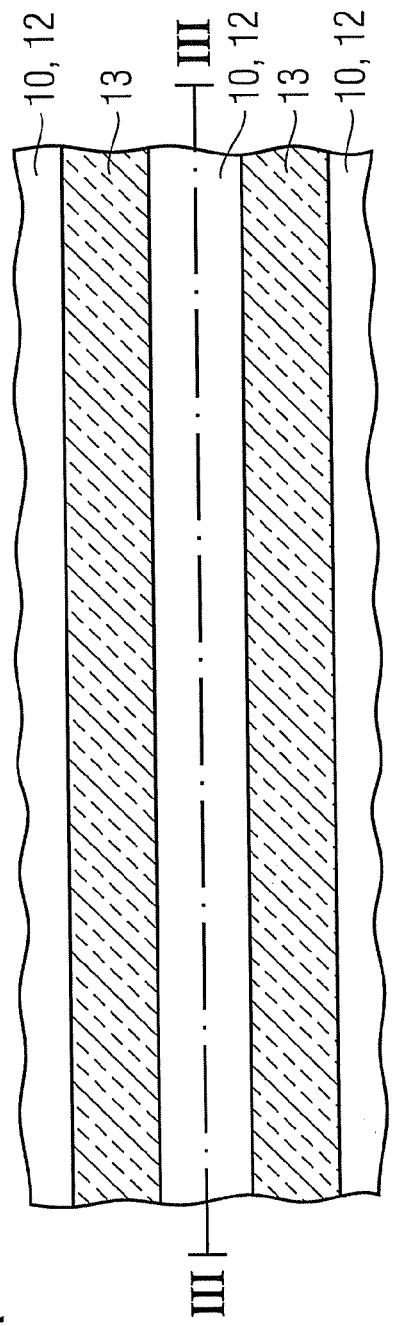
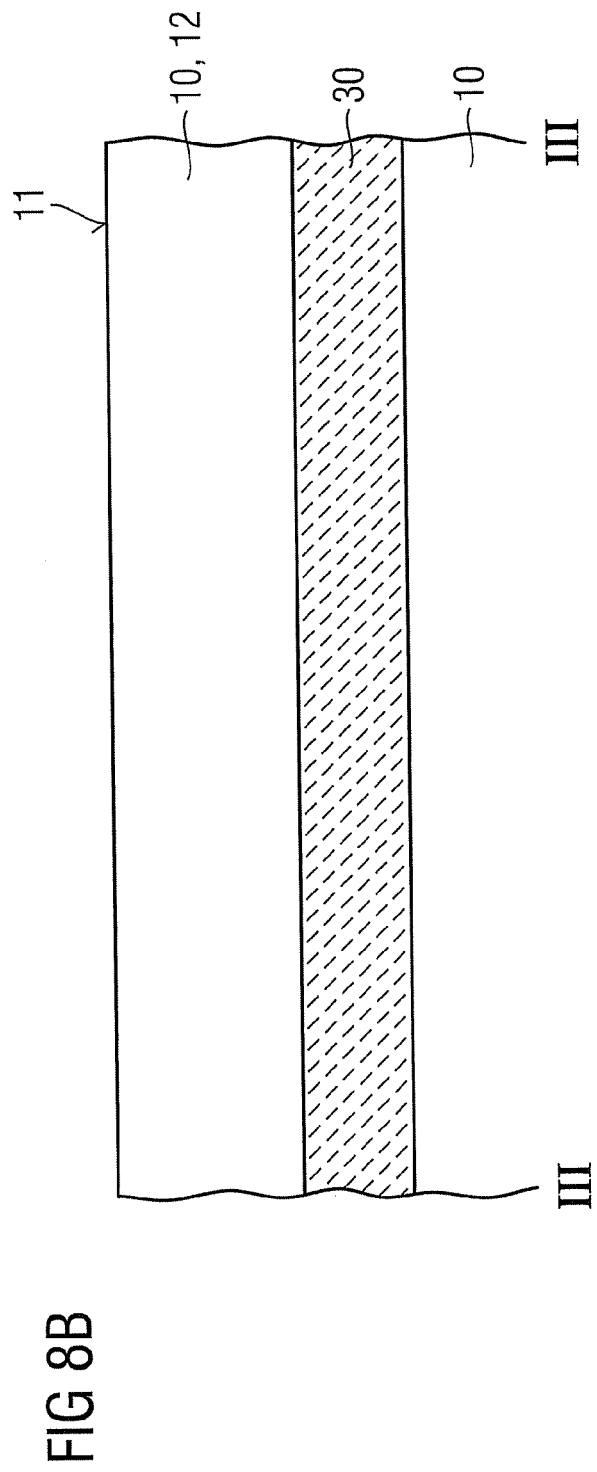
FIG 8A
FIG 8B

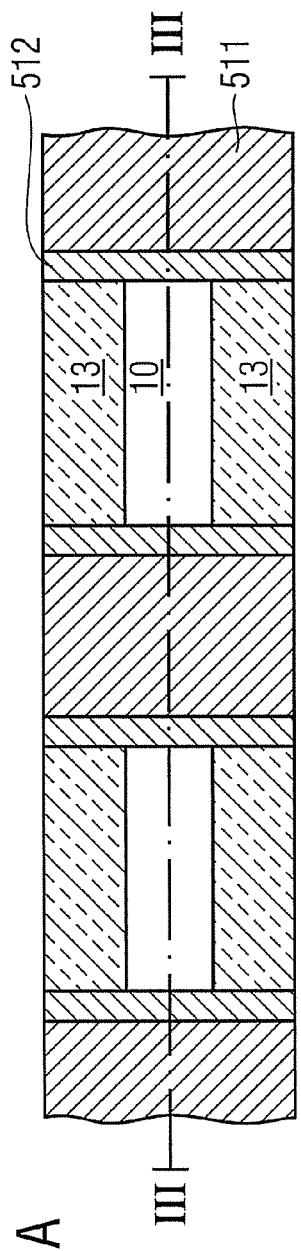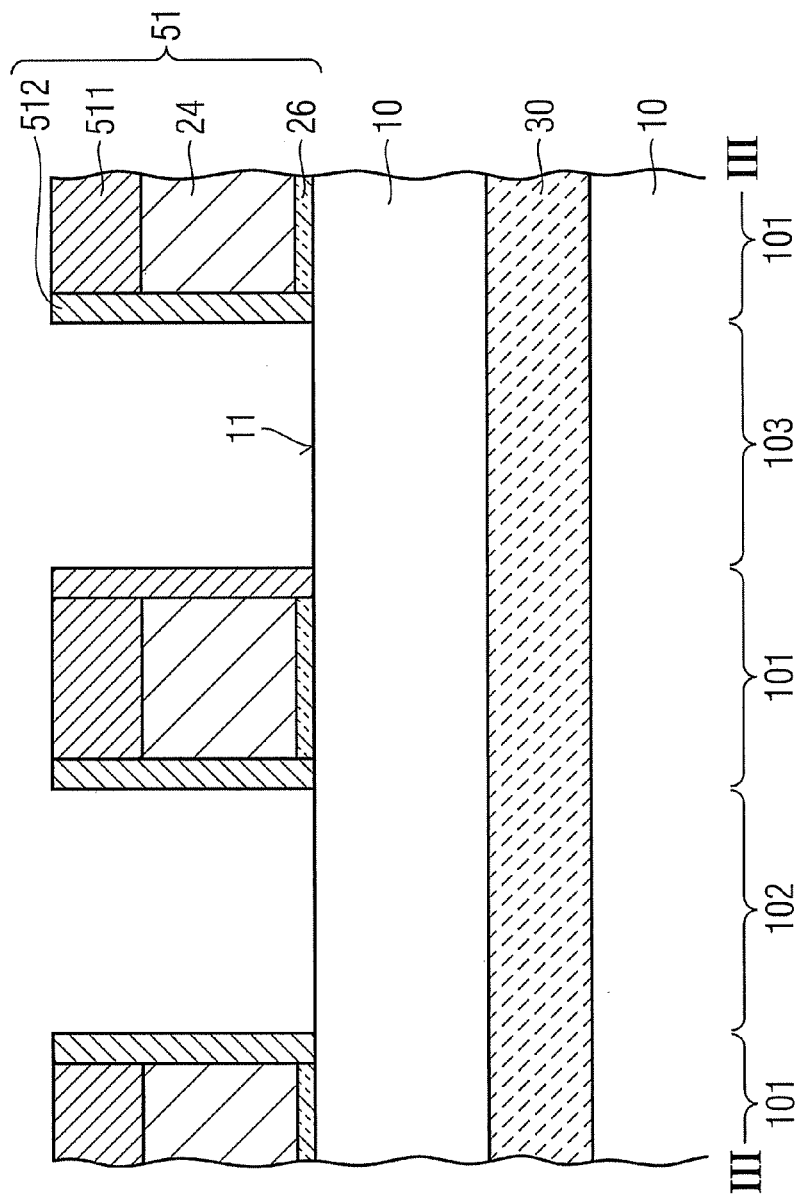
FIG 9A
FIG 9B

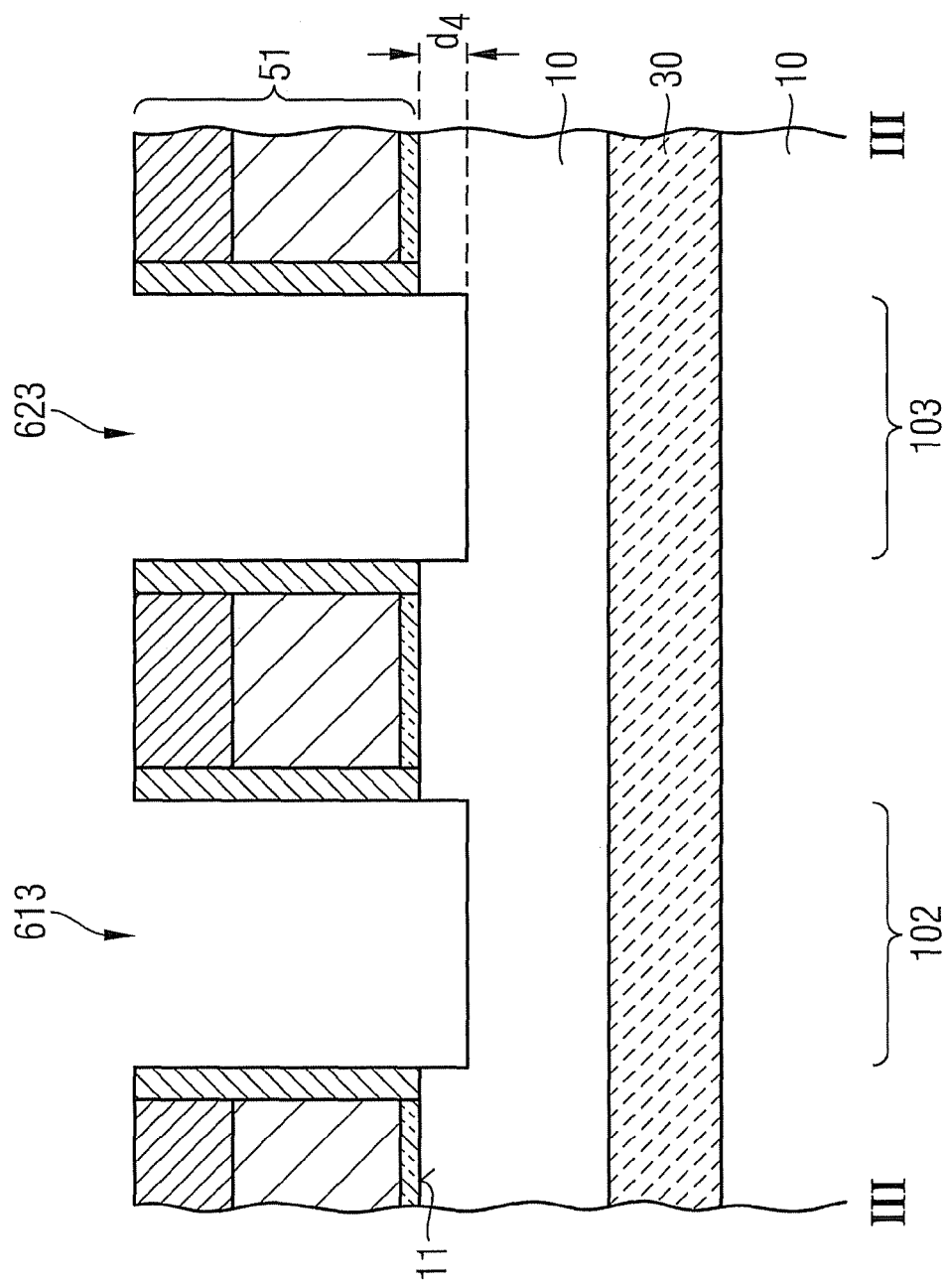

US 7,781,838 B2

INTEGRATED CIRCUIT INCLUDING A BODY TRANSISTOR AND METHOD

BACKGROUND

Floating body transistors are transistors with an electrically insulated transistor body and may be used in logic devices or as storage transistors in memory devices, for instance in DRAMs (Dynamic Random Access Memories).

For instance, capacitor-less DRAMs may include memory cells with floating body transistors. An information or state of an individual memory cell is determined by the concentration of charge within the body region of the floating body transistor. Reading and writing an information from or into an individual memory cell may be accomplished by activating a corresponding bit line, a corresponding source line and/or a corresponding word line. The source line may be electrically coupled to a first source/drain region of the floating body transistor, the bit line may be electrically coupled to a second source/drain region of the floating body transistor, and the word line is electrically coupled to a gate electrode of the floating body transistor.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 4B illustrates a plan view on a memory array region including floating body transistors according to one embodiment.

FIG. 5A illustrates a cross-sectional view of the memory array region of FIG. 4B along intersectional line I-I.

FIG. 8A illustrates a plan view on a portion of an integrated circuit including active areas for illustrating a method of manufacturing an integrated circuit in accordance with one embodiment.

FIG. 8B illustrates a cross-sectional view of the integrated circuit of FIG. 8A along intersection line III-III.

FIG. 9A illustrates a plan view on the portion of the integrated circuit of FIG. 8A after forming a first masking structure.

FIG. 9B illustrates a cross-sectional view of the portion of the integrated circuit of FIG. 9A along intersection line III-III.

FIG. 10 illustrates a cross-sectional view of the portion of the integrated circuit of FIG. 9B after forming first and second initial grooves.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
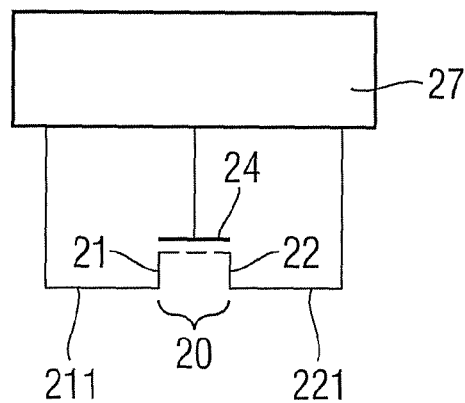
FIG. 1 illustrates a block diagram of an integrated circuit including a floating body transistor according to one embodiment.

FIG. 1 illustrates a block diagram of one embodiment of an integrated circuit including a transistor 20. The transistor 20 includes a first and a second source/drain region 21, 22 The first source/drain region 21 may be electrically coupled to a circuitry 27 by a source contact 211, and the second source/drain region 22 may be electrically coupled to the circuitry 27 by a drain contact 221, wherein the circuitry 27 may be configured to operate the transistor 20 as a memory cell. The transistor 20 further includes a gate electrode 24, which also may be electrically coupled to the circuitry 27.

As used herein, the term "electrically coupled" is not meant to mean that the elements must be directly coupled together. In the context of the present specification, intervening elements may be provided between the "electrically coupled" elements.

Figure 2A:
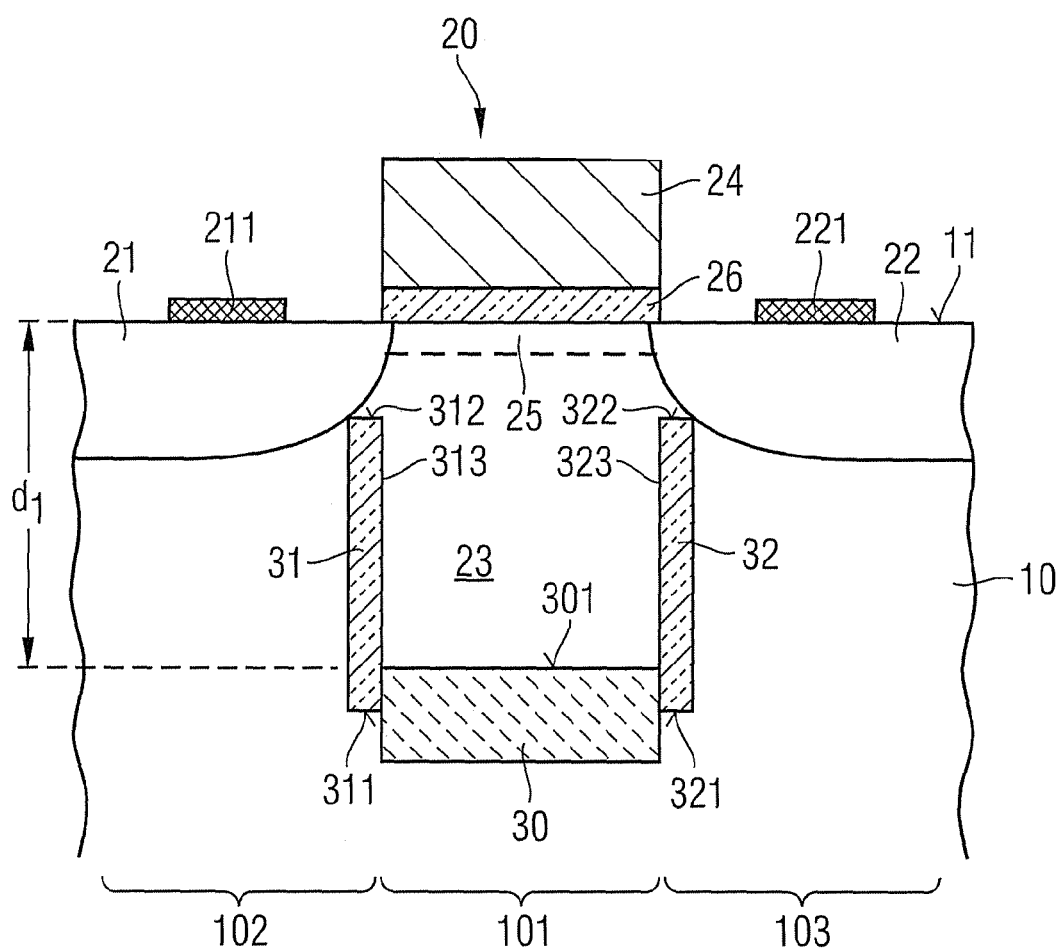
FIG. 2A illustrates a cross-sectional view of a floating body transistor and two lateral insulating structures below the source/drain regions according to one embodiment.

FIG. 2A illustrates a cross-sectional view of one embodiment of the integrated circuit illustrated in FIG. 1, wherein the transistor 20 includes a body region 23. The body region 23 is formed in a semiconductor substrate 10 in a first portion 101 of the integrated circuit. The first source/drain region 21 is formed in a second portion 102 of the integrated circuit and the second source/drain region 22 is formed in a third portion 103 of the integrated circuit. The first and the second source/drain regions 21, 22 may be formed within the semiconductor substrate 10 and may be formed adjacent to an upper surface 11 of the semiconductor substrate 10. Nevertheless, the first and the second soured/drain regions 21, 22 may be formed outside the semiconductor substrate 10, for instance in a single- or polycrystalline semiconductor material. A gate insulator 26 insulates the gate electrode 24 from the body region 23. In a first state of the transistor 20, a channel 25 is formed between the first and the second source/drain region 21, 22 in the body region adjacent to the gate insulator 26. The body region 23 has a first conductivity type and the first and the second source/drain region 21, 22 have a second conductivity type opposite to the first conductivity type. The first conductivity type may be the p-type, by way of example.

The integrated circuit further includes a buried structure 30, which is configured to insulate the body region 23 from the semiconductor substrate 10 below the buried structure 30. The buried structure 30 is disposed below the body region 23 and may extend at least between a first and a second lateral insulating structure 31, 32. The first and the second lateral insulating structure 31, 32 are disposed at least between the body region 23 and regions of the second and the third portion 102, 103 below the first and the second source/drain region 21, 22. The first and the second lateral insulating structure 31, 32 may be in direct contact with the buried structure 30. For instance, a sidewall 313 of the first lateral insulating structure 31 and a sidewall 323 of the second lateral insulating structure 32 may contact the buried structure 30 as illustrated in FIG. 2A. According to another embodiment, a lower surface 311 of the first lateral insulating structure 31 and a lower surface 321 of the second lateral insulating structure may contact the buried structure 30. The lower surfaces 311, 321 may be formed at a larger depth than an upper surface 301 of the buried structure 30, the depth being measured from the upper surface 11 of the semiconductor substrate 10.

The buried structure 30 and the first and the second lateral insulating structure 31, 32 form a closed and compact insulating structure that insulates the body region 23 from further portions of the integrated circuit, for instance from surrounding portions of the semiconductor substrate 10. For example, an upper surface 312 of the first lateral insulating structure 31 may contact a junction of the first source/drain region 21 to the semiconductor substrate 10, and an upper surface 322 of the second lateral insulating structure 32 may contact a junction of the second source/drain region 22 to the semiconductor substrate 10, as illustrated in FIG. 2A. By way of example, a charge may be generated in the body region 23 or injected into the body region 23 of the transistor 20 by applying predetermined voltage pulses between the gate electrode 24 and one of the source/drain regions 21, 22 and between the source and the drain region 21, 22. The charge that may be stored inside the electrically insulated body region 23 affects a so called body potential of the body region 23. The transistor 20 may form a one-transistor floating-body memory cell.

The body region 23 may extend to a depth d1 which may be equal to the depth of the upper surface 301 of the buried structure 30. According to one embodiment, the depth d1 may be larger than or equal to 100 nm. The depth d1 may for instance be smaller than or equal to 500 nm. A large amount of charges may be stored in the body region 23 compared with a SOI transistor including a thin body region.

The transistor 20 may be formed as a planar transistor, wherein the channel 25 includes only horizontal portions, or as a transistor with vertical channel portions, for instance as a double gate transistor, a surrounding gate transistor, a U-groove transistor or others.

The term "semiconductor substrate" used in the following description may include any semiconductor-based structure that has a semiconductor surface. The structure may include silicon, doped and undoped semiconductors, epitaxial layers of silicon supported by a base semiconductor foundation, and other semiconductor structures. The semiconductor may be silicon, silicon-based, silicon-germanium, germanium, gallium arsenide, or others. Further components, devices or integrated circuits may be formed within the semiconductor substrate.

According to one embodiment, the buried structure 30 may be formed of an insulating material. According to another embodiment, the buried structure 30 may be formed of a semiconductor material having the second conductivity type which is opposite to that of the body region 23. For instance, the buried structure 30 may be formed as a buried layer or as a well, in which the body region 23 is formed as an oppositely doped portion. The first and the second lateral insulating structure 31, 32 are formed of an insulating material, such as $SiO_2$, $SiO_x$, SiN, fluorinated silicate glass (FSG), boro-phosphorous silicate glass (BPSG), or other suitable insulating materials or layer stacks of such insulating materials. The first and the second lateral insulating structure 31, 32 may have a thickness not less than 5 nm, they may have a thickness of not more than 30 nm.

The buried structure 30 may be formed only in the first portion 101 beneath the body region 23, as illustrated in FIG. 2A. According to another embodiment, illustrated by example in FIG. 2B, the buried structure 30 may extend into the second and the third portion 102, 103. The buried structure 30 may be a buried layer of a semiconductor material or a well as described above. The lower surface 311 of the first lateral insulating structure 31 or the lower surface 321 of the second lateral insulating structure 32 may be formed above the lower surface 302 of the buried structure 30. Then, the buried structure 30 which is made of a semiconductor material may be electrically coupled to a contact such that the buried structure 30 may be configured to be held at a predetermined potential, for instance, the ground potential. By way of example, a contact 303 to the buried structure 30 is illustrated in a fourth portion 104 of the integrated circuit. The contact 303 may be formed of a conductive material insulated from the semiconductor substrate 10 by an insulating material 304. The distance between the upper surface 301 of the buried structure 30 and the lower junction of the first and the second source/drain region 21, 22 to the semiconductor substrate 10 may be defined sufficiently large in order to prevent a shortcircuit between the first and the second source/drain region 21, 22 and the buried structure 30.

Figure 2B:
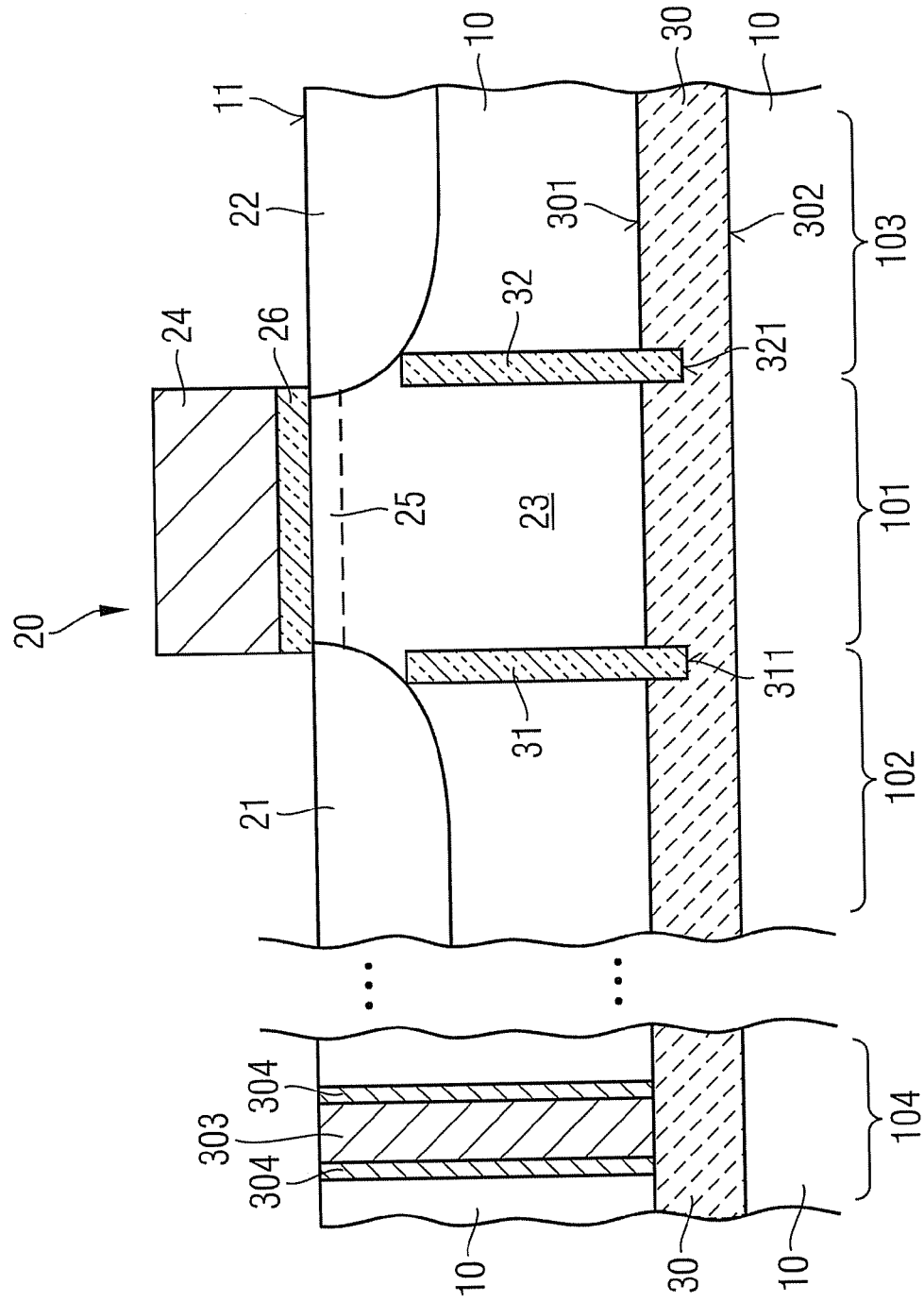
FIG. 2B illustrates a cross-sectional view of a floating body transistor and two lateral insulating structures extending into a buried structure according to one embodiment.
Figure 2C:
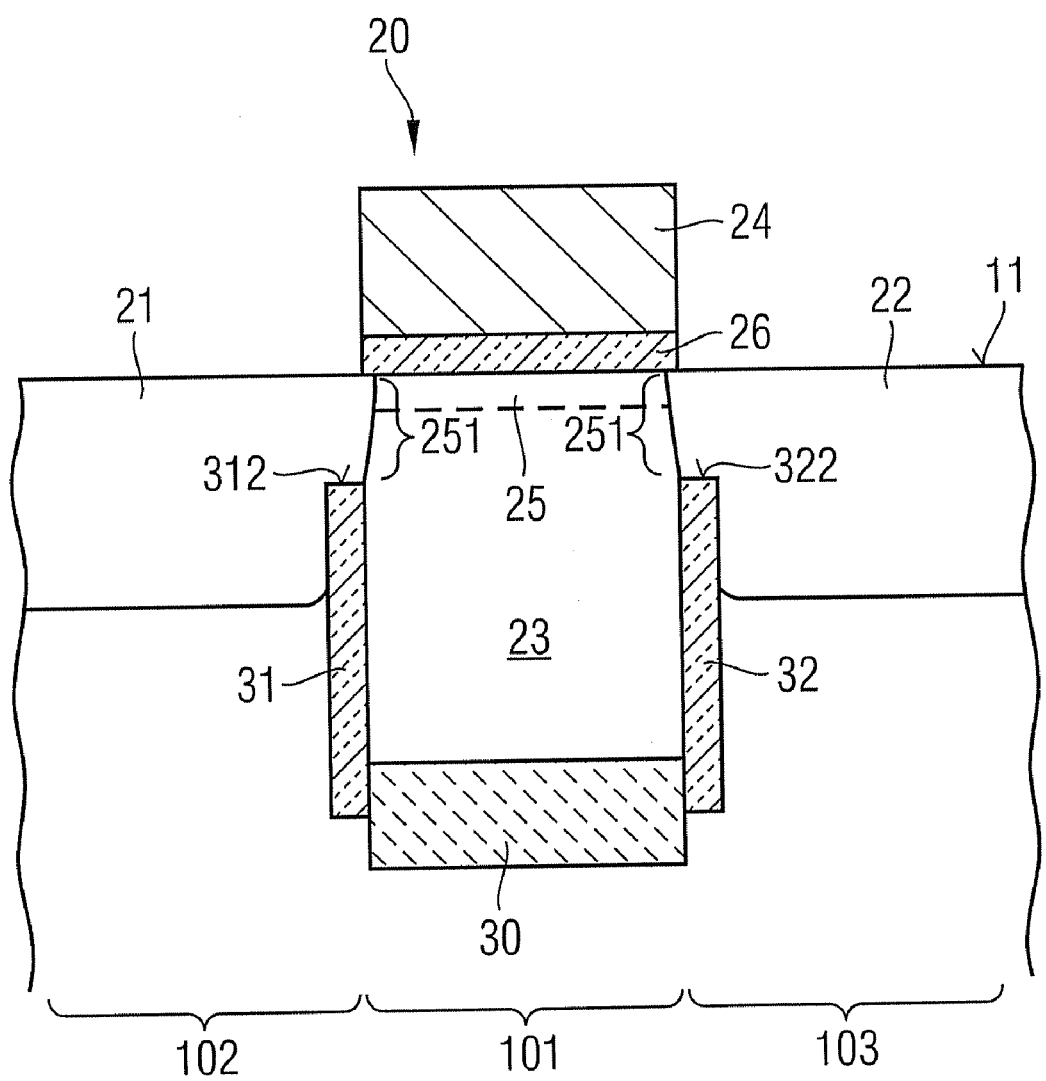
FIG. 2C illustrates a cross-sectional view of a floating body transistor and two lateral insulating structures extending in sections between the source/drain regions and the transistor body according to one embodiment.

According to the embodiment illustrated in FIG. 2C, a portion of the first lateral insulating structure 31 and/or of the second lateral insulating structure 32 is disposed between the first or the second source/drain region 21, 22 and the body region 23, respectively. At least a portion of the first lateral insulating structure 31 or of the second lateral insulating structure 32 is formed above the junction of the first or the second source/drain region 21, 22, respectively, to the semiconductor substrate 10. The upper surfaces 312 and 322 are spaced from the upper surface 11 of the semiconductor substrate 10 such that channel contact regions 251 are formed between the upper surface 11 and the upper surfaces 312 and 322. The upper surface 11 is adjacent to the gate insulator 26. Each channel contact region 251 electrically couples the source/drain regions 21, 22 to the channel 25. The channel contact regions 251 may extend into the semiconductor substrate 10 to a depth of approximately 50 to 100 nm. The portions of the first or the second lateral insulating structure 31, 32, which are disposed between the first or the second source/drain region 21, 22, and the body region 23, may reduce a leakage current between the body region 23 and the respective source/drain regions 21, 22.

Figure 3A:
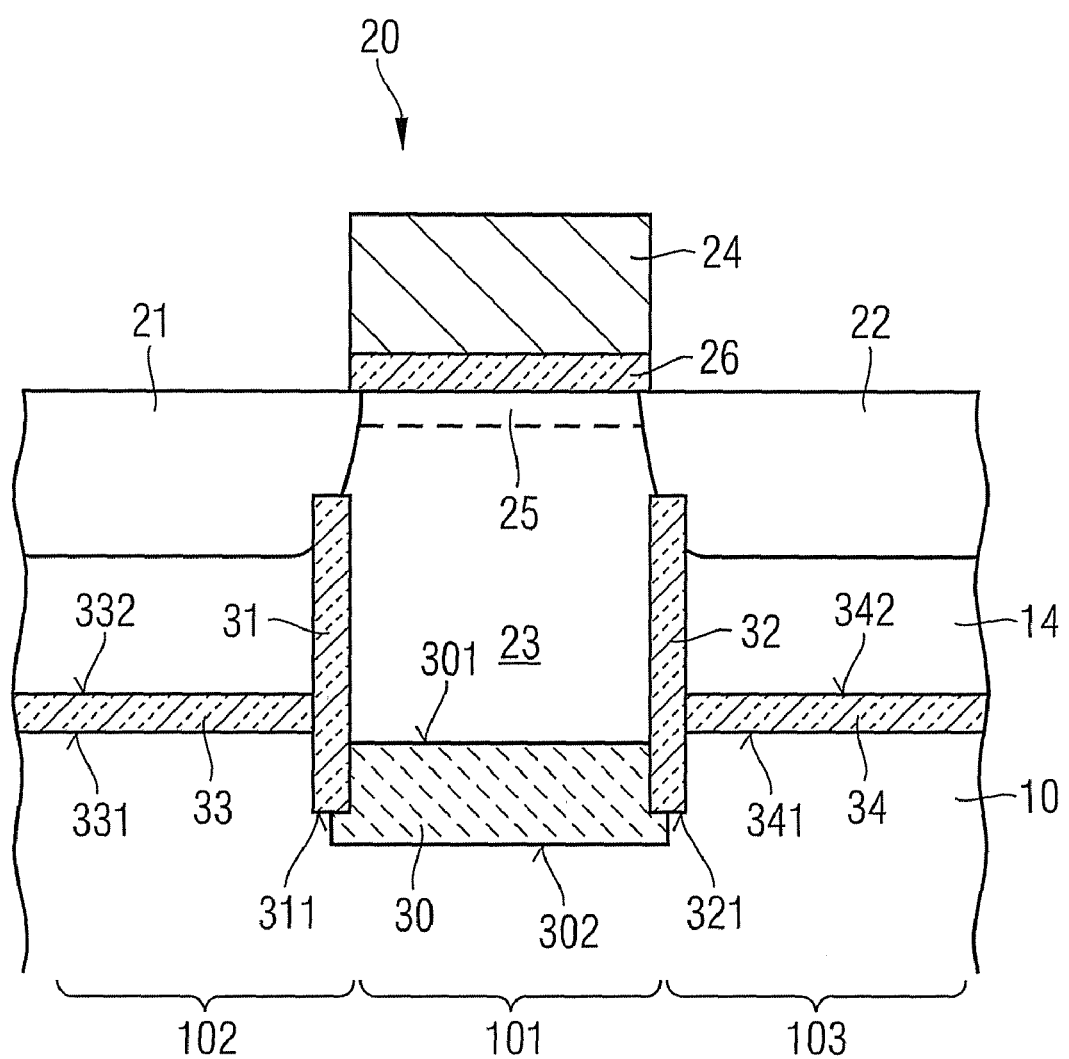
FIG. 3A illustrates a cross-sectional view of a floating body transistor and two lateral insulating structures adjoining a horizontal insulating structure according to another embodiment.

FIG. 3A refers to an integrated circuit which further includes at least a first or a second horizontal insulating structure 33, 34. The first horizontal insulating structure 33 is disposed in the second portion 102 of the integrated circuit below the first source/drain region 21 and at least contacts the first lateral insulating structure 31. The second horizontal insulating structure 34 is disposed in the third portion 103 of the integrated circuit below the second source/drain region 22 and may be in direct contact with the second lateral insulating structure 32. A lower surface 331 of the first horizontal insulating structure 33 may be disposed at a depth smaller than, equal to or larger than the lower surface 311 of the first lateral insulating structure 31 or the lower surface 302 of the buried structure 30. A lower surface 341 of the second horizontal insulating structure 34 may be disposed at a depth smaller than, equal to or larger than the lower surface 321 of the second lateral insulating structure 32 or the lower surface 302 of the buried structure 30. An upper surface 332 of the first horizontal insulating structure 33 or an upper surface 342 of the second horizontal insulating structure 34 may be disposed at a depth smaller than, equal to or larger than the upper surface 301 of the buried structure 30. A semiconductor material 14 is disposed above the first and second horizontal insulating structures 33, 34. The semiconductor material 14 may be a part of the semiconductor substrate 10 or may be a single- or polycrystalline semiconductor material formed, for instance, by epitaxy. The first and the second source/drain region 21, 22 are formed within the semiconductor material 14. The upper surfaces 332, 342 may be spaced from the lower junctions of the first and the second source/drain region 21, 22 to the semiconductor material 14. According to another embodiment, the upper surfaces 332, 342 may directly adjoin to the first or the second source/drain region 21, 22, respectively.

The first and the second horizontal insulating structure 33, 34 are formed of an insulating material, for example $SiO_2$, $SiO_x$, SiN, fluorinated silicate glass (FSG), boro-phosphorous silicate glass glass (BPSG), or another suitable insulating material or layer stacks of insulating materials. The first or the second horizontal insulating structure 33, 34 may be formed of the same insulating material as the first or the second lateral insulating structure 31, 32 or of that of the buried structure 30. If an insulating material forms the buried structure 30, the first or the second horizontal insulating structure 33, 34 may be a part of that buried structure 30.

The terms "lateral" and "horizontal" are used to describe the orientation of the insulating structures with respect to a substrate surface of the semiconductor substrate, wherein the substrate surface is adjacent to a gate insulator of the transistor. "Lateral" means that the corresponding structure is oriented in a direction different from the direction of the substrate surface, whereas "horizontal" means that the corresponding structure is oriented in a direction substantially equal to the direction of the substrate surface. That is, an angle measured between a sidewall of a lateral insulating structure and the substrate surface is larger than 0° and smaller than 180°. The lateral insulating structures may be formed vertical to the substrate surface, that is the angle may be 90° as illustrated in FIGS. 2A to 3A, or may be formed slanted. Furthermore, the lateral and/or the horizontal insulating structures may have straight, bowed or waved sidewalls or any other conture.

Figure 3B:
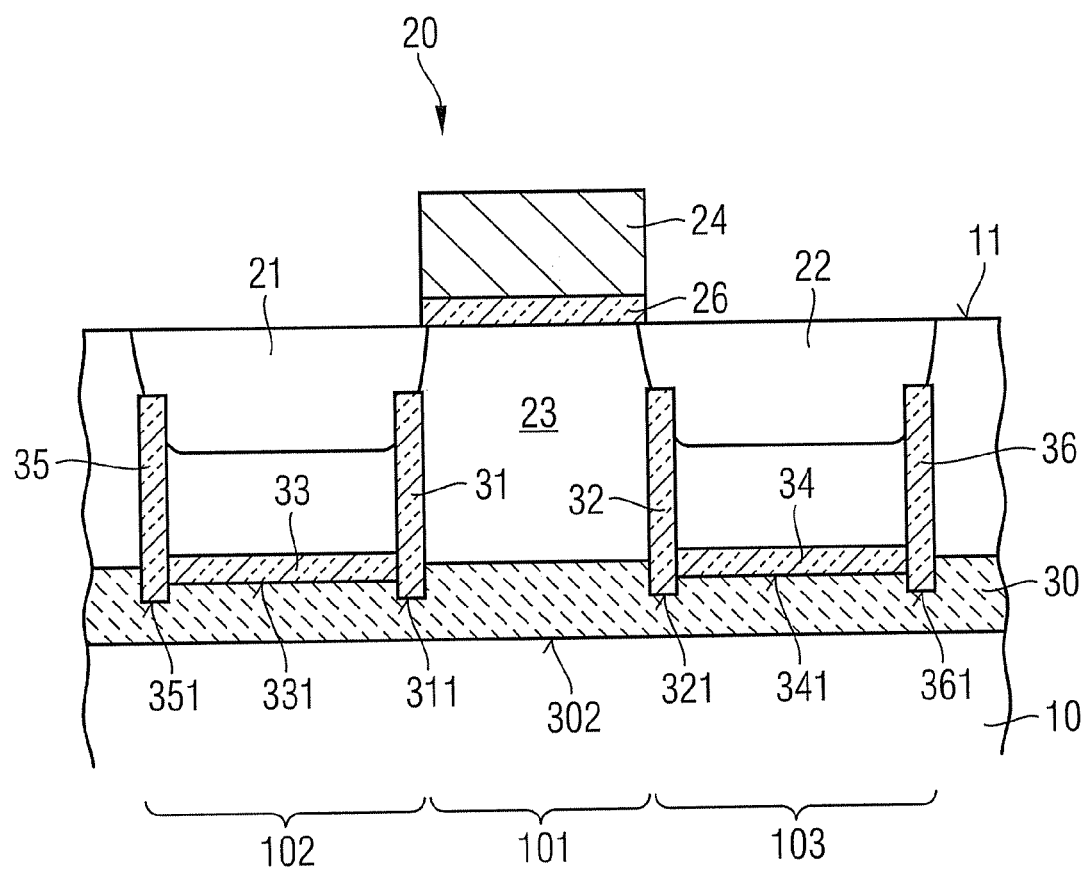
FIG. 3B illustrates a cross-sectional view of a floating body transistor and two well-shaped insulating structures below the source/drain regions according to one embodiment.

FIG. 3B refers to an integrated circuit including at least one of the horizontal insulating structures described with respect to FIG. 3A and the buried structure 30 described with respect to FIG. 2B. The integrated circuit further includes a third and a fourth lateral insulating structure 35, 36, which may be in direct contact with the first or the second horizontal insulating structure 33, 34, respectively. The third and the fourth lateral insulating structure 35, 36 may be formed in the same manner as the first and the second lateral insulating structure 31, 32 as described with respect to FIGS. 2A to 2C. The first and the third lateral insulating structure 31, 35 are formed on opposing sides of the first source/drain region 21, and the second and the fourth lateral insulating structure 32, 36 are formed on opposing sides of the second source/drain region 22. The lower surfaces 331, 341 or lower surfaces 351 and 361 of the third and the fourth lateral insulating structure 35, 36, respectively, may be disposed at a depth smaller than a depth at which the lower surface 302 of the buried structure 30 is disposed. All or individual ones of the lower surfaces 311, 321, 331, 341, 351 and 361 may be disposed at the same depth or at different depth measured from the upper surface 11.

Several other combinations of the embodiments of the integrated circuit illustrated in FIGS. 2A to 3B may be formed.

Figure 4A:
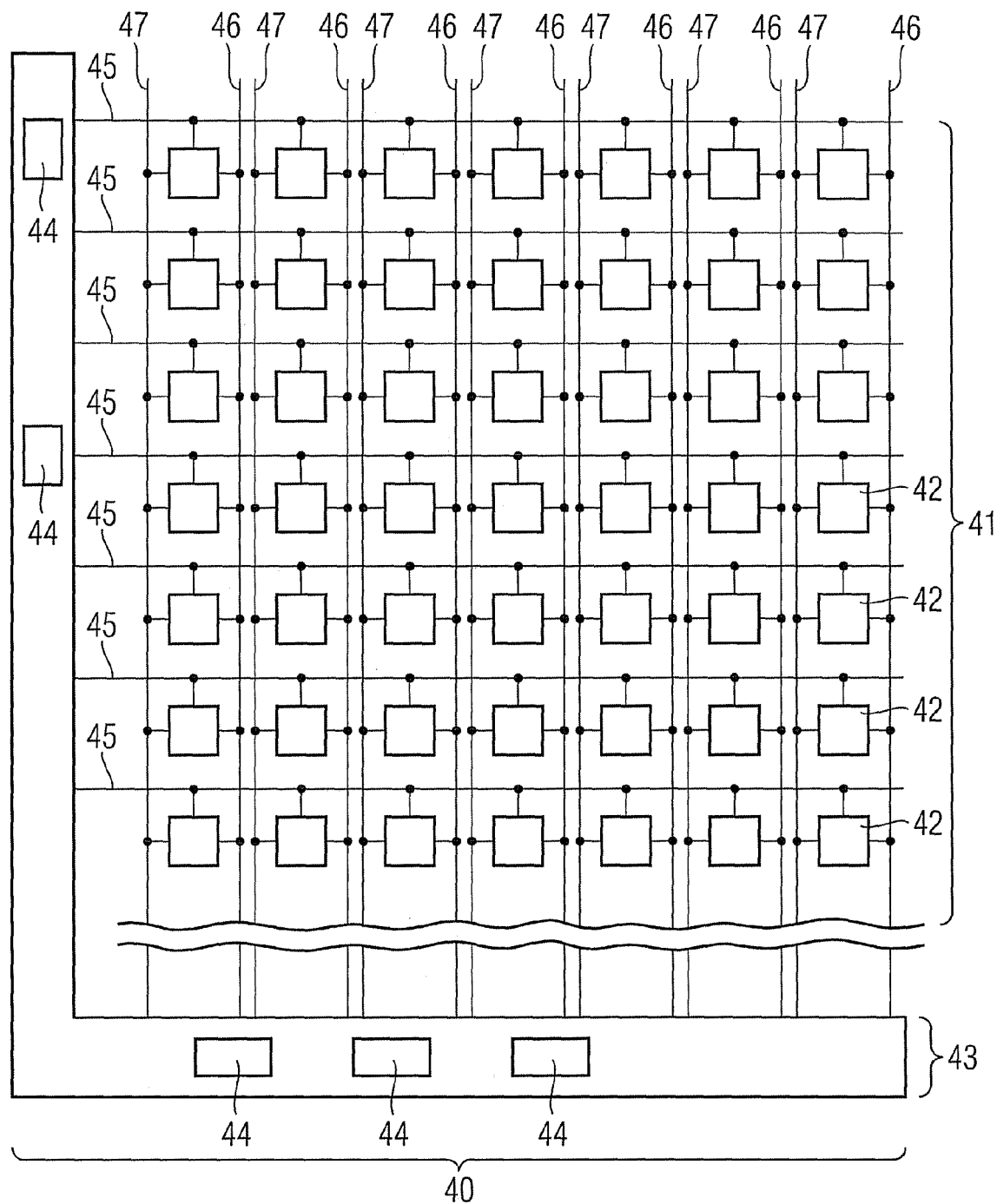
FIG. 4A is a block circuit diagram of a memory cell array including floating body transistors according to one embodiment.

FIG. 4A refers to a simplified circuit diagram of an integrated circuit including a memory device 40. The memory device 40 includes a plurality of memory cells 42 arranged in a memory array region 41 and a support region 43, that includes control devices 44 configured to control and operate the memory cells 42. The control devices 44 may be word line drivers, sense amplifiers or other devices. Individual ones of the memory cells 42 may be a one-transistor floating-body memory cell including a transistor 20, a buried structure 30 and a first and a second lateral insulating structure 31, 32 as described with respect to FIGS. 2A to 3B. The integrated circuit may further include a plurality of conductive lines, for example word lines 45, bit lines 46 and source lines 47, wherein the conductive lines are configured to connect individual ones of the memory cells 42 with the control devices 44. In the embodiment illustrated in FIG. 4A, the word lines 45 run along a first direction, whereas the bit lines 46 and the source lines 47 run along a second direction different from the first direction. Nevertheless, other layouts of word lines, bit lines and source lines or other architectures of the memory cell array are possible, for instance source lines running along the first direction.

Writing an information into a memory cell 42 may be accomplished by activating a corresponding bit line 46, a corresponding source line 47 as well as a corresponding word line 45. Moreover, reading may be accomplished by activating a corresponding bit line 46 as well as a corresponding source line 47 or a corresponding word line 45. By way of example, reading or writing may be accomplished by setting the source line 47 to an elevated voltage while maintaining the corresponding bit line 46 at a low voltage. In one embodiment, reading or writing may be accomplished by setting a corresponding bit line 46 to an elevated voltage while maintaining a corresponding source line 47 at a low voltage. Accordingly, the control devices 44 are configured to cause a predetermined potential difference between a selected bit line 46 and a selected source line 47 to select a memory cell 42 which is coupled to the selected bit line and the selected source line. Nevertheless, the specific mechanism of reading and writing an information may also be any different one.

FIG. 4B refers to the memory array region 41 of the integrated circuit of FIG. 4A and illustrates an embodiment. A plurality of active areas 12 is formed in a semiconductor substrate 10 wherein neighboring active areas 12 are insulated from each other by isolation trenches 13. The word lines 45 run into a direction different from the direction of the active areas 12 and of the isolation trenches 13. Bit line contacts 461 and source line contacts 471 are formed adjacent to individual portions of the active areas 12. The source line contacts 471 electrically couple first source/drain regions to the source lines 47, and the bit line contacts 461 electrically couple the second source/drain regions of the memory cells 42 to the bit lines 46. The dashed line outlines the area of one individual memory cell 42.

FIG. 5A illustrates a cross sectional view of the memory array region 41 illustrated in FIG. 4B along line I-I which runs along ones of the active areas 12. An individual one of the memory cells 42, for instance the memory cell 42 in the center of FIG. 5A, includes a transistor 20 that includes a first and a second source/drain region 21, 22, a body region 23, a gate electrode 24 and a gate insulator 26. The source/drain regions 21, 22 and the body region 23 are formed in the active area 12, wherein the body region 23 is formed in the semiconductor substrate 10 and the source/drain regions 21, 22 are formed in a semiconductor material 14 as described with respect to FIG. 3A. The memory cell 42 further includes a first and a second lateral insulating structure 31, 32, a first and a second horizontal insulating structure 33, 34, a third and a fourth lateral insulating structure 35, 36 and a buried structure 30 as described with respect to FIGS. 3A and 3B. Two neighboring memory cells 42, for instance the memory cells 42 at the left side and in the center of FIG. 5A, share the first source/drain region 21 which may be electrically coupled to a source line contact 471. The third lateral insulating structure 35 of the memory cell 42 in the center of FIG. 5A coincides with a first lateral insulating structure of the memory cell 42 at the left side of FIG. 5A. Two neighboring memory cells 42, for instance the memory cells 42 in the center and at the right side of FIG. 5A, share the second source/drain region 22 which may be electrically coupled to a bit line contact 461. The fourth lateral insulating structure 36 of the memory cell 42 in the center of FIG. 5A coincides with a second lateral insulating structure of the memory cell 42 at the right side of FIG. 5A. The buried structure 30 is formed as a buried layer extending beneath the memory cells 42 from the left to the right side of FIG. 5A.

Word lines 45 include the gate electrode 24 and a cap layer 451. The cap layer 451 may be formed of a conductive material such as a metal, a noble metal or a metal alloy, for example, or of an insulating material. Conductive material includes polysilicon, Co, Ni, Ti, Ta, W, NiPt, TiN, TaN, TaSiN, Ru, WN, and HfN, silicides, as for instance CoSi, TiSi, NiSi, NiPtSi, $WSi_x$, TaSi, or other suitable silicide, or other suitable materials and combinations of such materials. Insulating material includes $SiO_2$, $SiO_x$, SiN, fluorinated silicate glass (FSG), boro-phosphorous silicate glass glass (BPSG), or other suitable insulating material. Spacers 48 may be formed along the sidewalls of the word lines 45. Spacers 48 may be formed of an insulating material as described above and may insulate the word lines 45 and the source and bit line contacts 471, 461 from each other.

Figure 5B:
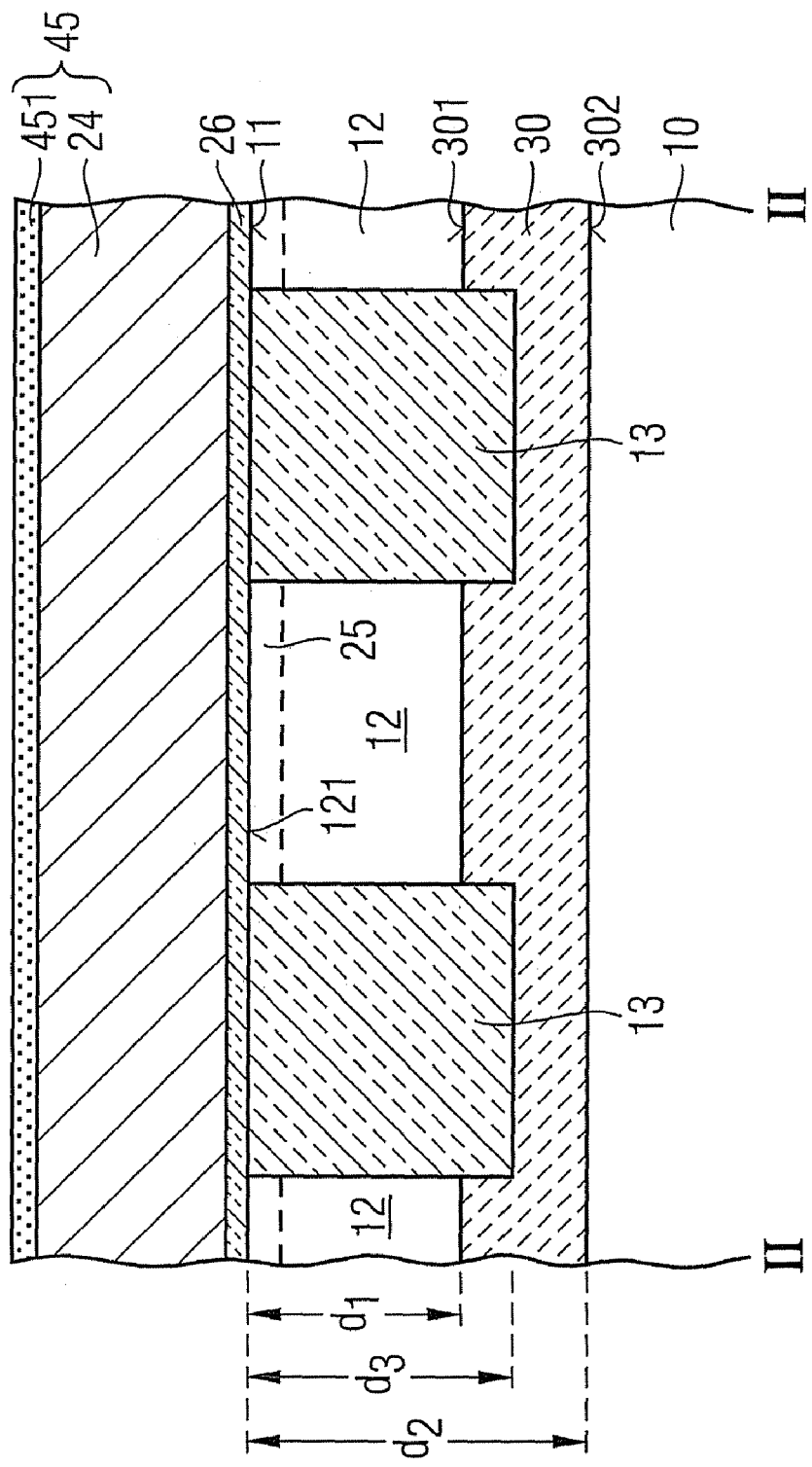
FIG. 5B illustrates a cross-sectional view of the memory array region of FIG. 4B along intersectional line II-II.

FIG. 5B refers to a cross sectional view of the memory array region 41 illustrated in FIG. 4B along line II-II which runs along a word line 45. The active areas 12 are insulated from each other by the isolation trenches 13 extending from an upper surface 11 of the semiconductor substrate 10 to a depth d3. The depth d3 may be larger than a depth d1, which is the depth at which an upper surface 301 of the buried structure 30 is disposed. The depth d3 may be smaller than a depth d2, which is the depth at which a lower surface 302 of the buried structure 30 is disposed. The transistor 20 is formed as a planar transistor, wherein a channel 25 of the transistor 20 is formed adjacent to an upper surface 121 of the active area 12 and includes only horizontal portions.

Figure 5C:
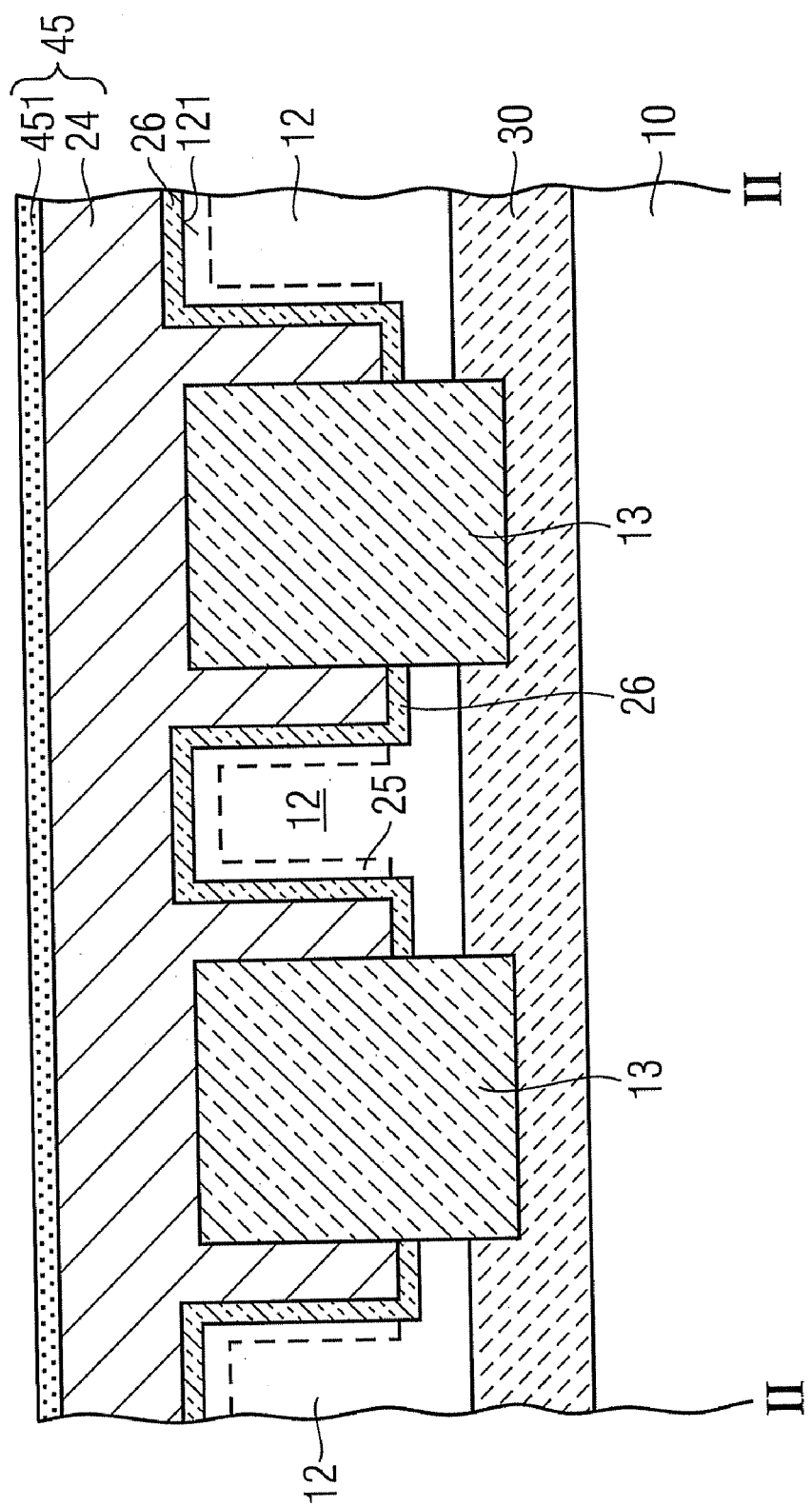
FIG. 5C illustrates a cross-sectional view of another embodiment of the memory array region of FIG. 4B along line II-II.

According to another embodiment, the active area 12 may be formed as a ridge, as illustrated in FIG. 5C, wherein the gate electrode 24 is disposed at least two sides of the active area 12. Thus the gate electrode 24 includes portions, which are disposed between a portion of an adjacent isolation trench 13 and a portion of the active area 12, and the channel 25 includes vertical portions.

Figure 6:
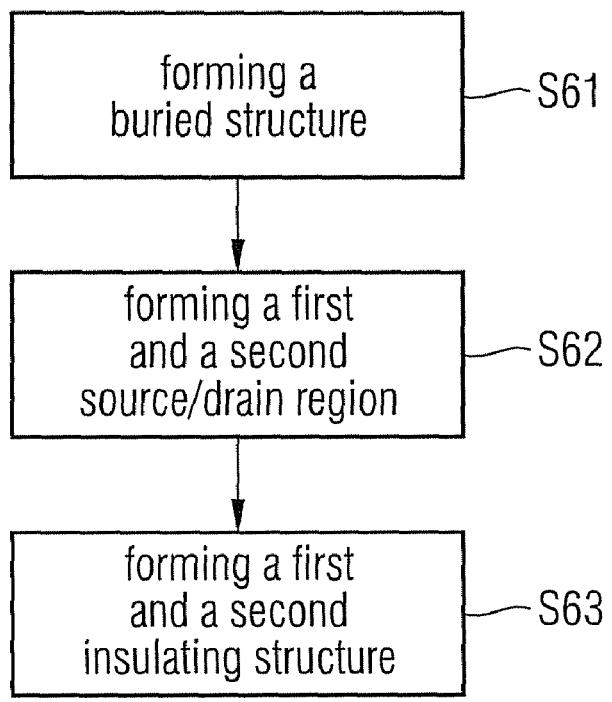
FIG. 6 illustrates a flow chart illustrating a method of manufacturing an integrated circuit including a floating body transistor in accordance with one embodiment.

FIG. 6 is a flow chart illustrating an embodiment of a method of manufacturing an integrated circuit. A buried structure is formed in a semiconductor substrate having a first conductivity type at least within a first portion of the integrated circuit (S61). The buried structure may be formed of an insulating material or of a semiconductor material having a second conductivity type opposite to the first conductivity type. The buried structure may be formed as an isolated structure disposed only in the first portion of the integrated circuit or may be formed as a buried layer extending also in other portions of the integrated circuit. A first and a second source/drain region having a second conductivity type opposite to the first conductivity type are formed in a second and a third portion of the integrated circuit (S62). The second and the third portion of the integrated circuit are disposed on opposite sides of the first portion of the integrated circuit. The first and the second source/drain region are formed adjacent to an upper surface of the semiconductor substrate.

A first and a second lateral insulating structure are formed at least between a region of the first portion of the integrated circuit disposed above the buried structure and regions of the second and the third portion of the integrated circuit below the first and the second source/drain region, wherein the first and the second lateral insulating structures at least contact the buried structure (S63). The first and the second lateral insulating structure are formed such that they are disposed between that region of the first portion of the integrated circuit, which is disposed between the upper surface of the semiconductor substrate and an upper surface of the buried structure, and that regions of the second and the third portion of the integrated circuit, which are disposed below the first and the second source/drain region adjacent to a junction between the first or the second source/drain region and the semiconductor substrate, respectively, and extend in the semiconductor substrate to a depth where the upper surface of the buried structure is disposed.

Figure 7:
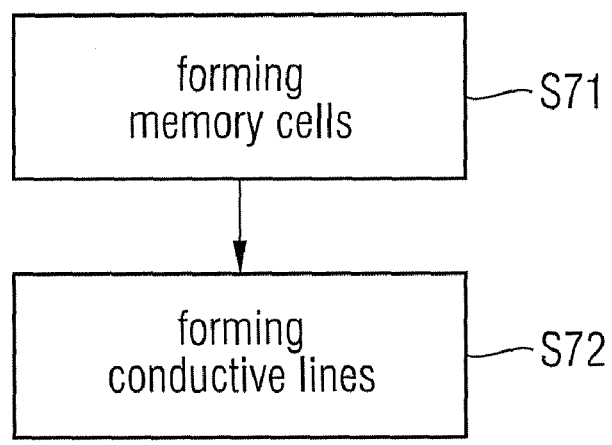
FIG. 7 illustrates a flow chart illustrating a method of manufacturing an integrated circuit including a floating body transistor in accordance with one embodiment.

FIG. 7 is a flow chart illustrating another embodiment of a method of manufacturing an integrated circuit including a memory device. A plurality of memory cells are formed in a memory array region of the integrated circuit (S71). An individual one of the memory cells includes a transistor including a body region formed in a semiconductor substrate in a first portion of the integrated circuit and a first and a second source/drain region formed in a second and a third portion of the integrated circuit. The individual one of the memory cells further includes a buried structure disposed at least below the body region and a first and a second lateral insulating structure disposed at least between the body region and regions of the second and the third portion of the integrated circuit below the first and the second source/drain regions, wherein the first and the second lateral insulating structure at least contact the buried structure. The plurality of memory cells may be formed by an embodiment of the method described with respect to FIG. 6.

Further, a plurality of conductive lines is formed (S72). The conductive lines are configured to electrically couple individual ones of the memory cells to control devices configured to control and operate the memory cells. The control devices are formed in a support region of the integrated circuit. The plurality of conductive lines may include bit lines, source lines and word lines, wherein a corresponding source line may be electrically coupled to the first source/drain region of a respective memory cell, a corresponding bit line may be electrically coupled to the second source/drain region of a respective memory cell and a corresponding word line is electrically coupled to a gate electrode of a respective memory cell.

FIGS. 6 and 7 do not describe a defined sequence of processing steps of the described methods. The sequence of forming a buried structure, forming source/drain regions and forming first and second lateral insulating structures or the sequence of forming the memory cells and forming the conductive lines may be that illustrated in the flow charts of FIGS. 6 and 7 or may be vice versa. In addition, each of the processing steps may include various sub-steps so that the succession of the sub-steps of one processing step may be mixed with the succession of the sub-steps of another processing step. If, for instance, a method recites "forming memory cells" and "forming conductive lines", a first part of the components of the memory cells may be formed before or after forming a first part of the components of the conductive lines, and a second part of the components of the conductive lines may be formed before or after forming a second part of the components of the memory cells.

FIG. 8A illustrates a plan view on a portion of an integrated circuit in accordance with an embodiment. Active areas 12 may be formed as lines running in a first direction in a semiconductor substrate 10. Isolation trenches 13 running in the first direction are disposed in the semiconductor substrate 10 between individual ones of the active areas 12. The active areas 12 may be formed as isolated regions or as angled or wounded lines as well. The semiconductor substrate 10 has a first conductivity type.

FIG. 8B illustrates a cross-sectional view of the integrated circuit of FIG. 8A along line III-III, that is along an individual one of the active areas 12. As can be seen, a buried structure 30 is formed in the semiconductor substrate 10. The buried structure 30 is configured to insulate at least a portion of an individual one of the active areas 12 extending from an upper surface 11 of the semiconductor substrate 10 to the buried structure 30 from the semiconductor substrate 10 below the buried structure 30. The isolation trenches 13 at least contact the buried structure 30, as described with respect to FIG. 5B.

If the buried structure 30 is formed as a continuous structure below the active areas 12, individual ones of the active areas 12 are insulated from each other by adjacent ones of the isolation trenches 13 and by the buried structure 30. The buried structure 30 may, for instance, be formed of a semiconductor material of a second conductivity type opposite to the first conductivity type.

A plurality of first masking structures 51 is formed above the upper surface 11 of the semiconductor substrate 10 thereby defining first, second and third portions 101, 102, 103 of the integrated circuit. The first masking structures 51 are formed above the first portions 101 of the active areas 12, but may be formed as continuous lines running across the isolation trenches 13 into a second direction different from the first direction, for instance perpendicular to the first direction, as illustrated in FIG. 9A. FIG. 9A is a plan view on the integrated circuit of FIG. 8A after forming the first masking structure 51, whereas FIG. 9B illustrates a cross-sectional view of FIG. 9A along line III-III. The buried structure 30 is at least formed in the first portion 101.

As is illustrated in FIG. 9B, an individual one of the first masking structures 51 may include a gate insulator 26 adjacent to the upper surface 11 of the semiconductor substrate 10, a gate electrode 24 adjacent to the gate insulator 26, a top layer 511 adjacent to the gate electrode 24, and a sidewall layer 512 formed at sidewalls of the gate insulator 26, the gate electrode 24 and the top layer 511. The gate insulator 26, the top layer 511, and the sidewall layer 512 may be formed of an insulating material as described above. For example, the top layer 511 may be formed of SiN, whereas the sidewall layer 512 may be formed of $SiO_x$. The gate electrode 24 may be formed of doped or undoped polysilicon, for example. According to another embodiment, the first masking structure 51 may include any other suitable layers, layer stacks and materials which can be selectively formed and etched with respect to the material of the semiconductor substrate 10. The first masking structure 51 may include a layer stack, which forms a part of a conductive line, for instance a word line, connecting individual ones of the active areas 12.

The first masking structure 51 may be formed by known methods including, for example, deposition and patterning of layers formed of the materials of the gate insulator 26, the gate electrode 24 and the cap layer 511, followed by depositing and patterning a layer of the material of the sidewall layer 512. The material layers may be deposited using chemical vapor deposition (CVD), high density plasma-chemical vapor deposition (HDP-CVD), atomic layer deposition (ALD), metal organic chemical vapor deposition (MOCVD), physical vapor deposition (PVD), jet vapor deposition (JVD), or other suitable deposition technique. The material layers may be patterned using anisotropic dry etching technique, such like reactive ion etching (RIE), or other suitable technique.

At least one first and one second initial groove 613, 623 is formed in the semiconductor substrate 10 using the first masking structures 51, for instance, as an etching mask. The first initial groove 613 is formed in the second portion 102 of the integrated circuit, whereas the second initial groove 623 is formed in the third portion 103. The first and the second initial groove 613, 623 may be formed by an anisotropic etching process being selective to the materials of the cap layer 511 and the sidewall layer 512 of the first masking structure 51. In the result, the first and the second initial groove 613, 623 extend to a depth d4 measured from the upper surface 11. The depth d4 may equal a depth of channel contact regions 251 as described with respect to FIG. 2C. The resulting structure is illustrated in FIG. 10.

Figure 11:
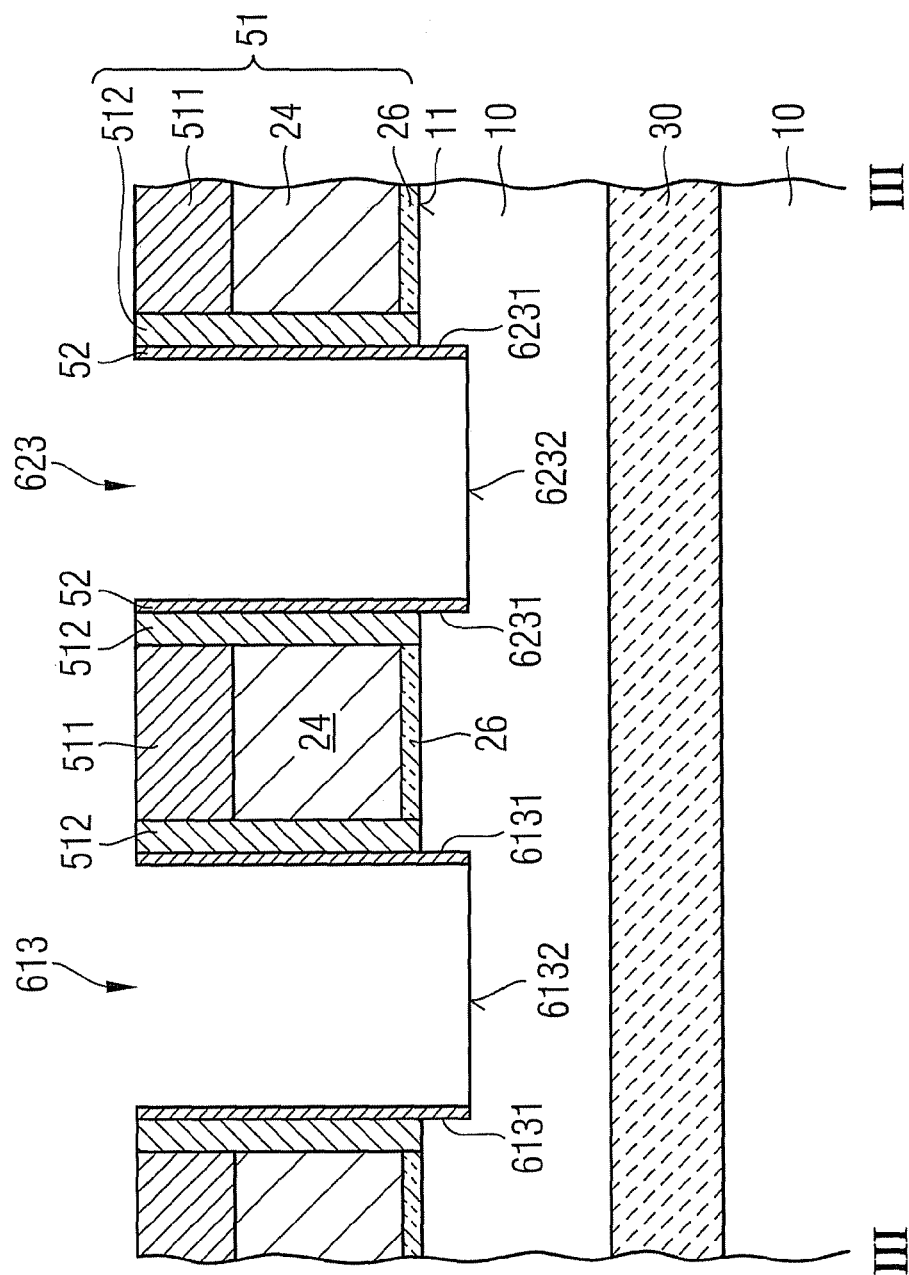
FIG. 11 illustrates a cross-sectional view of the portion of the integrated circuit of FIG. 10 after forming a second masking structure.

A second masking structure 52 may be formed at sidewalls 6131, 6231 of the first and the second initial groove 613, 623. The second masking structure 52 may be formed on the sidewall layers 512 of the first masking structures 51 as well, whereas bottom portions 6132, 6232 of the first and the second initial groove 613, 623 remain uncovered. The second masking structure 52 may be formed of an insulating material as described above, for instance of SiN. The second masking structure 52 may have a thickness not less than 5 nm, it may have a thickness of not more than 20 nm. The second masking structure 52 may be formed by depositing a conformal layer of an insulating material using a technique as described above and by removing the insulating material from the bottom portions 6132, 6232 using an anisotropic etching process selective to the semiconductor material 10 and to the materials of the top layer 511 and of the sidewall layer 512. The resulting structure is illustrated in FIG. 11.

Figure 12:
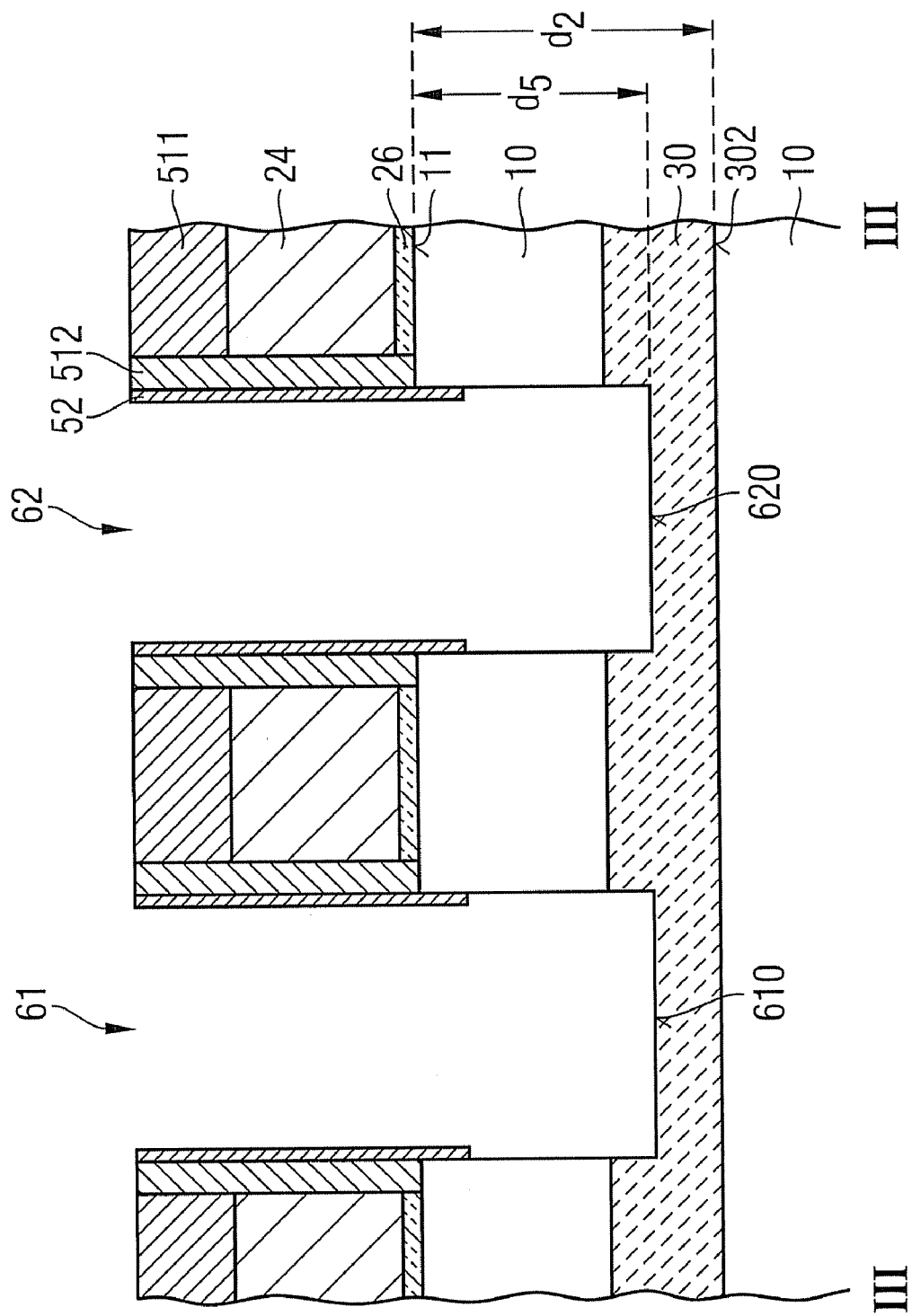
FIG. 12 illustrates a cross-sectional view of the portion of the integrated circuit of FIG. 11 after forming first and second grooves.

A first and a second groove 61, 62 are formed by extending the first and the second initial groove 613, 623 into the semiconductor substrate 10. The first and the second groove 61, 62 may for instance extend to a depth d5 measured from the upper surface 11. The depth d5 may be smaller than a depth d2, at which a lower surface 302 of the buried structure 30 is formed. That is, a lower surface 610, 620 of the first and the second groove 61, 62, respectively, may be disposed above the lower surface of the buried structure 30. In accordance with other embodiments, the lower surface 610, 620 may be disposed below the lower surface 302. However, the depth d5 should be defined such that a lateral insulating structure formed at sidewall portions of the first and the second groove 61, 62 in a later processing sequence at least contacts the buried structure 30. The resulting structure is illustrated in FIG. 12.

Figure 13:
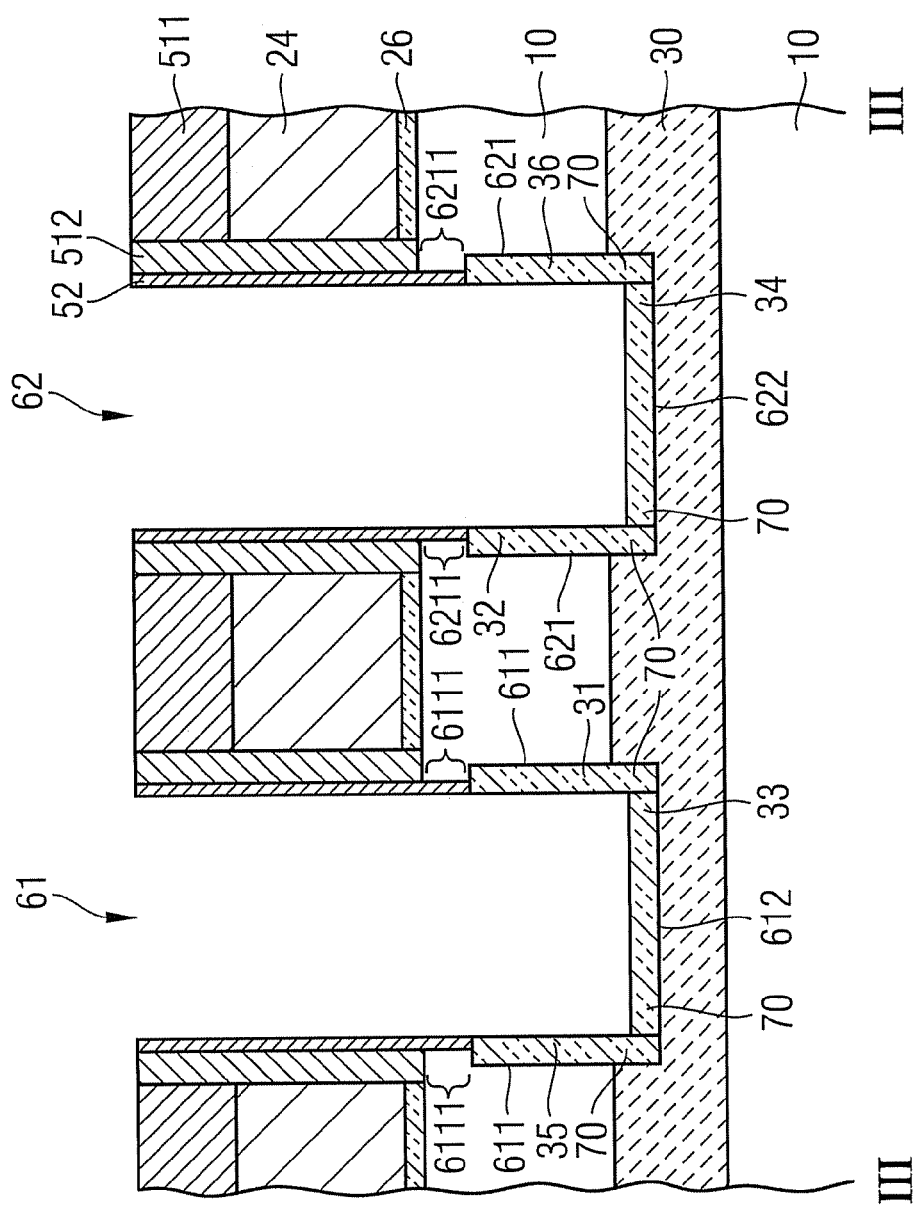
FIG. 13 illustrates a cross-sectional view of the portion of the integrated circuit of FIG. 12 after forming insulating structures.

An insulating structure 70 may be formed at sidewalls 611, 621 of the first and the second groove 61, 62. The insulating structure 70 may be formed at bottom portions 612, 622 of the first and the second groove 61, 62 as well. The insulating structure 70 may be formed by deposition or by selective oxidation. Selective oxidation is a process, wherein an oxide of the semiconductor material 10 is formed only on surfaces, where the semiconductor material 10 is uncovered. Thus, the insulating structure 70 is formed at the sidewalls 611, 621 and the bottom portions 612, 622 of the first and the second groove 61, 62 except of sidewall portions 6111, 6211 which are covered by the second masking structure 52, as illustrated in FIG. 13. The selective oxidation process may be carried out as a low temperature process. In case of appropriate masking materials, a selective nitridation process may be used in order to form the insulating structure 70. In case of forming the insulating structure 70 by a deposition technique as described above, a conformal layer or layer stack of insulating materials may be formed on all surfaces of the first and the second groove 61, 62, wherein the layer or the layer stack of the insulating materials is removed from the sidewall portions 6111, 6211 later. The sidewall portions 6111, 6211 correspond to the sidewalls 6131, 6231 of the first and the second initial groove 613, 623 and are adjacent to the upper surface 11 of the semiconductor substrate 10. The resulting structure is illustrated in FIG. 13.

The insulating structure 70 may include insulating materials such as $SiO_2$, $SiO_x$, SiN, fluorinated silicate glass (FSG), boro-phosphorous silicate glass glass (BPSG), or other suitable insulating materials. The insulating structure 70 may include different insulating materials or different layer stacks of insulating materials or insulating materials with different thicknesses at the sidewalls 611, 621 and the bottom portions 612, 622, respectively. The insulating structure 70 at the sidewalls 611, 621 may have a thickness not less than 5 nm, it may have a thickness of not more than 30 nm. The insulating structure 70 at the bottom portion 612, 622 may have a thickness not less than 5 nm, it may have a thickness of not more than 30 nm. The insulating structure 70 may have the same thickness or different thicknesses at the sidewalls 611, 621 as at the bottom portions 612, 622.

The insulating structure 70 at the sidewalls 611, 621 form first, second, third and fourth lateral insulating structures 31, 32, 35 and 36, as described with respect to FIG. 3B. The insulating structure 70 at the bottom portions 612, 622 form first and second horizontal insulating structures 33, 34 as described with respect to FIG. 3A.

Figure 14:
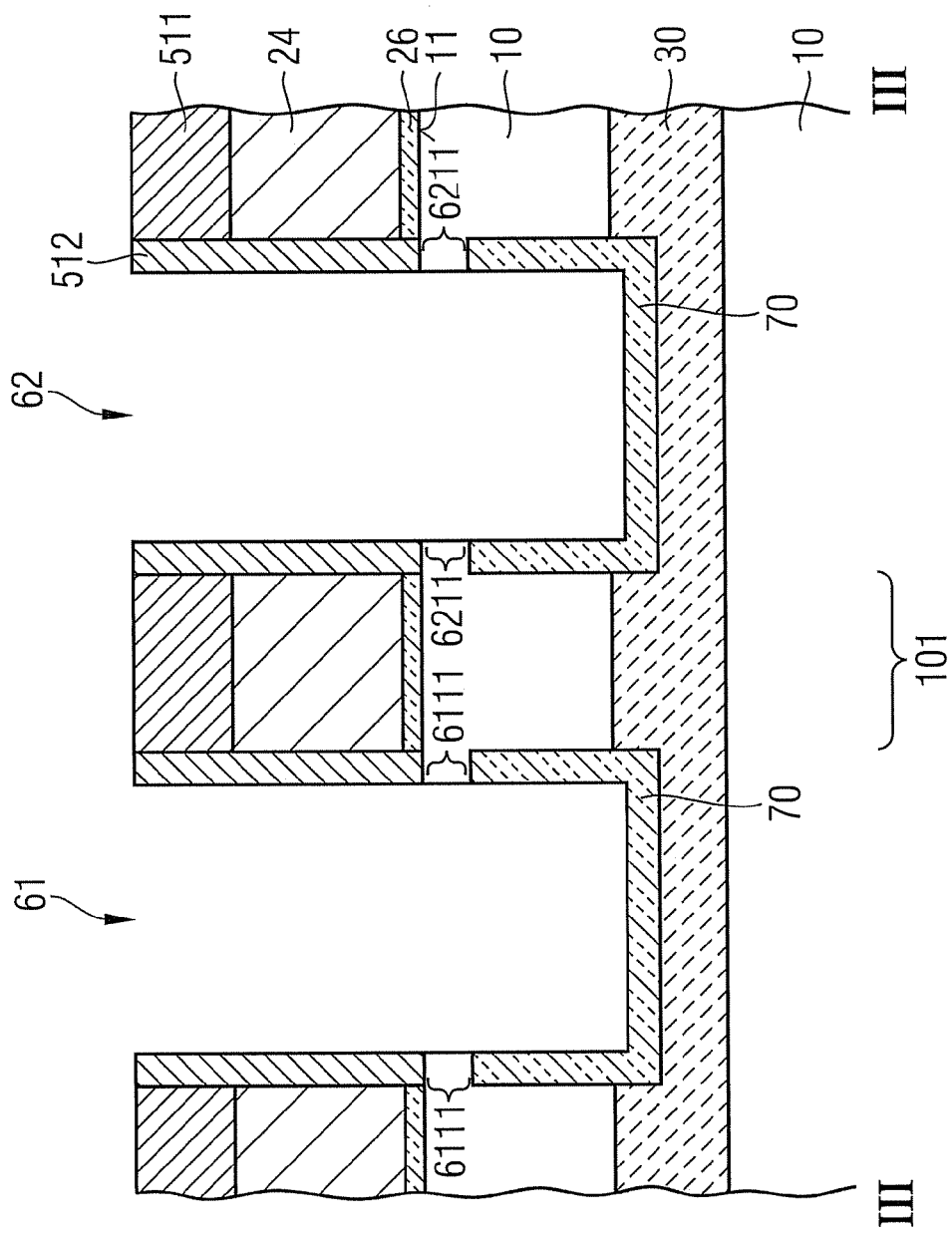
FIG. 14 illustrates a cross-sectional view of the portion of the integrated circuit of FIG. 13 after removing the second masking structure.

The second masking structure 52 may be removed from the sidewall layer 512 and the sidewall portions 6111, 6211 of the first and the second groove 61, 62. Wet or dry processes may be used for removing the second masking structure 52, wherein the process is selective to the material of the semiconductor substrate 10 and to the material of the insulating structure 70 and of the sidewall layer 512. The process may further be selective to the material of the top layer 511. In the result, the sidewall portions 6111, 6211 are uncovered and the semiconductor substrate 10 is exposed in that portions. The resulting structure is illustrated in FIG. 14.

Figure 15:
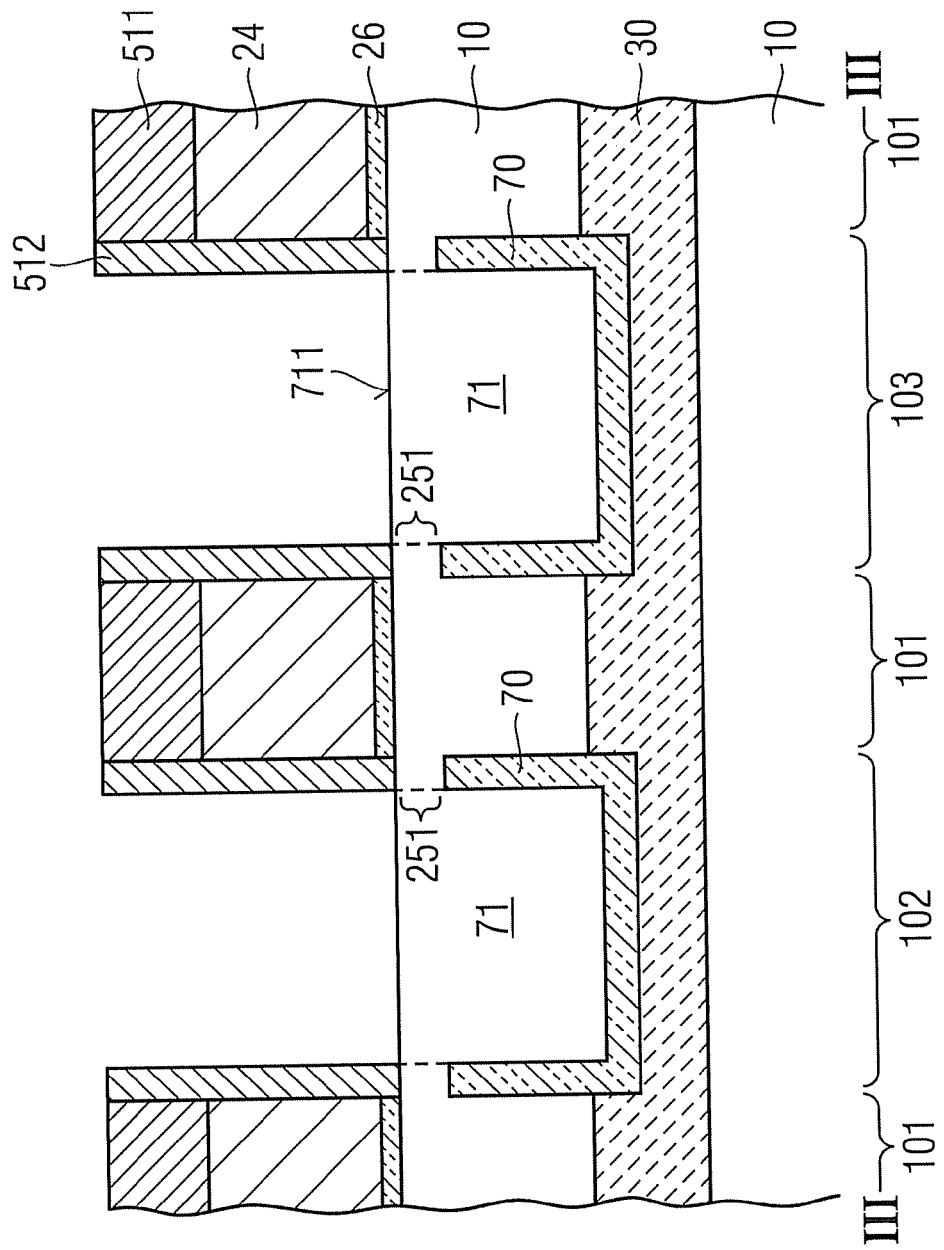
FIG. 15 illustrates a cross-sectional view of the portion of the integrated circuit of FIG. 14 after forming a semiconductor material.

A semiconductor material 71 is formed within the first and the second groove 61, 62. The semiconductor material 71 may be formed by an epitaxial process or by a deposition process or by a combination of a deposition and an epitaxial process. The semiconductor material 71 may be the same material as that of the semiconductor substrate 10 and it may have a single-crystalline or a poly-crystalline structure. It may be formed doped or undoped, wherein the conductivity type of the semiconductor material 71 may be the first or the second one. The semiconductor material 71 at least fills the first and the second groove 61, 62, wherein a portion of the semiconductor material 71 exceeding the upper surface 11 may be removed by a recess process. In the result, an upper surface 711 of the semiconductor material 71 may be disposed at the level of the upper surface 11 of the semiconductor substrate 10. The resulting structure is illustrated in FIG. 15.

The semiconductor material 71 may form the second and the third portion 102, 103 of the integrated circuit. The semiconductor material 71 is electrically coupled to the semiconductor substrate 10 in the first portion 101 by channel contact regions 251 which are formed at sidewall portions 6111, 6211.

The top layer 511 may be removed, for instance by wet or dry etching. The top layer 511 may be removed selective to the semiconductor material 71, the material of the semiconductor substrate 10, the material of the gate electrode 24, and the material of the sidewall layer 512. The sidewall layer 512 may be removed or may remain. Spacers 48 may be formed at sidewalls of the gate insulator 26 and the gate electrode 24. The spacers 48 may be formed of an insulating material as described above and may be formed by depositing a conformal layer of an insulating material using a technique described above followed by an anisotropic etching process. The spacers 48 may include the sidewall layer 512 if it was not removed before depositing the insulating material.

Figure 16:
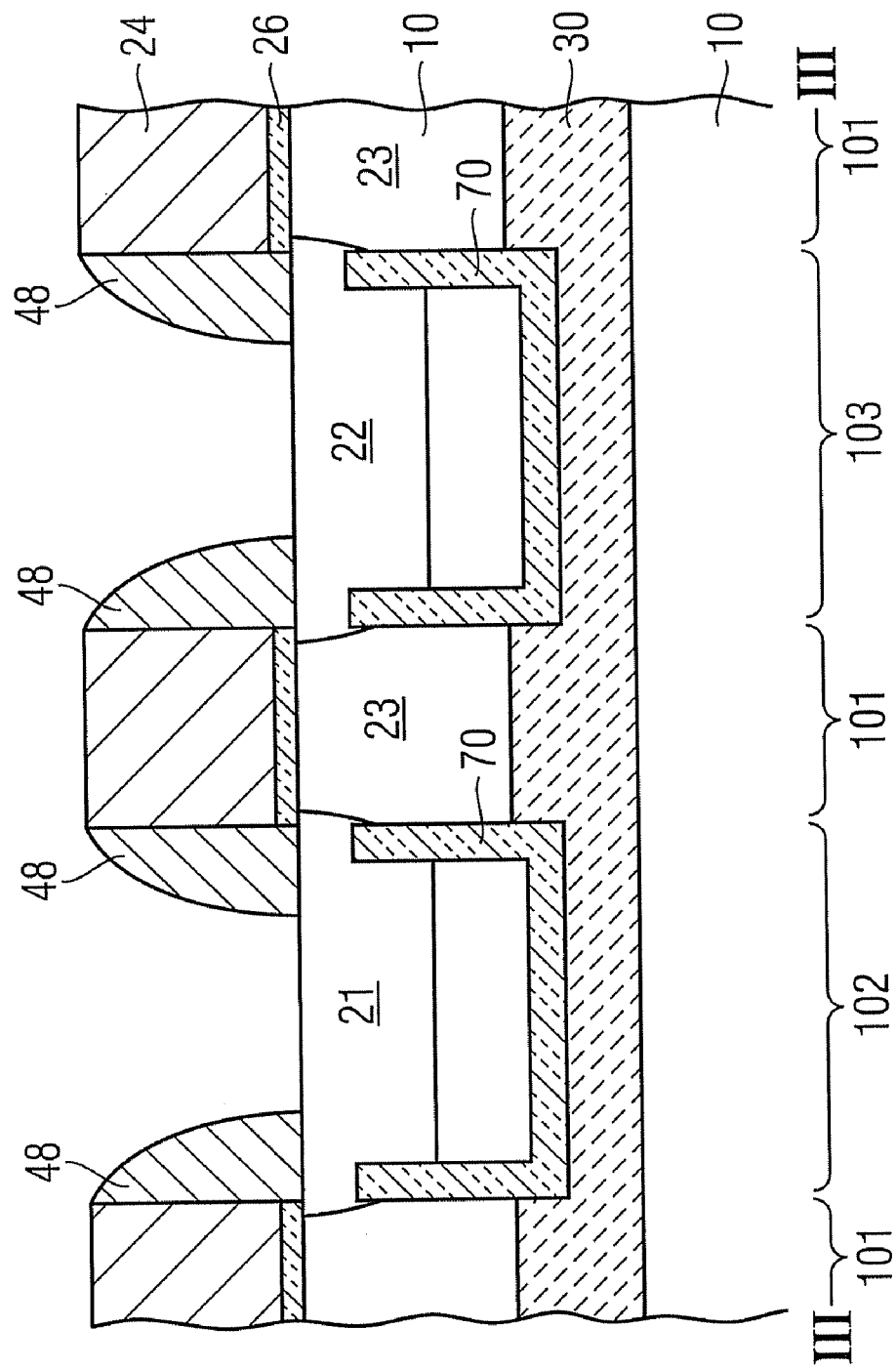
FIG. 16 illustrates a cross-sectional view of the portion of the integrated circuit of FIG. 15 after forming source/drain regions.

A first and a second source/drain region 21, 22 of the second conductivity type are formed in the second and the third portion 102, 103 of the integrated circuit. They may be formed by implantation using the gate electrodes 24 and the spacers 48 as implantation masks or by another doping process. Nevertheless, a further doping process may be performed before forming the spacers 48, thereby forming lightly doped portions of the first and the second source/drain region 21, 22. Dopants may be brought in the gate electrode 24 as well during the formation of the first and the second source/drain region 21, 22. The resulting structure is illustrated in FIG. 16.

A bit line contact 461 and a source line contact 471 may be formed in the second and the third portion 102, 103 of the integrated circuit. The bit line contact 461 is electrically coupled to the second source/drain region 22, for instance, whereas the source line contact 471 is electrically coupled to the first source/drain region 21, for instance. The bit line contact 461 and the source line contact 471 may be formed by forming a semiconductor-metal alloy using a salicide formation process. In the same process, a cap layer 451 may be formed on an upper surface of the gate electrode 24, wherein the gate electrode 24 and the cap layer 451 may form a word line 45. The bit line contact 461, the source line contact 471 and the cap layer 451 may be formed self-aligned on exposed surfaces of the first and the second source/drain region 21, 22 and of the gate electrode 24. The resulting structure is illustrated in FIG. 5A, wherein the line III-III in FIGS. 8A to 16 corresponds to the line I-I in FIG. 5A.

As is clearly to be understood, a plurality of memory cells may be formed by the method described with respect to FIGS. 8A to 16. Furthermore, a contact or another electrical coupling connection to the buried structure 30 may be formed such that the buried structure is configured to be held at a predetermined potential.

The method of manufacturing an integrated circuit is compatible to other bulk CMOS technologies and may save costs. Furthermore, the manufactured floating body transistors are scalable and a threshold voltage of the transistors may be defined precisely.

Figure 17:
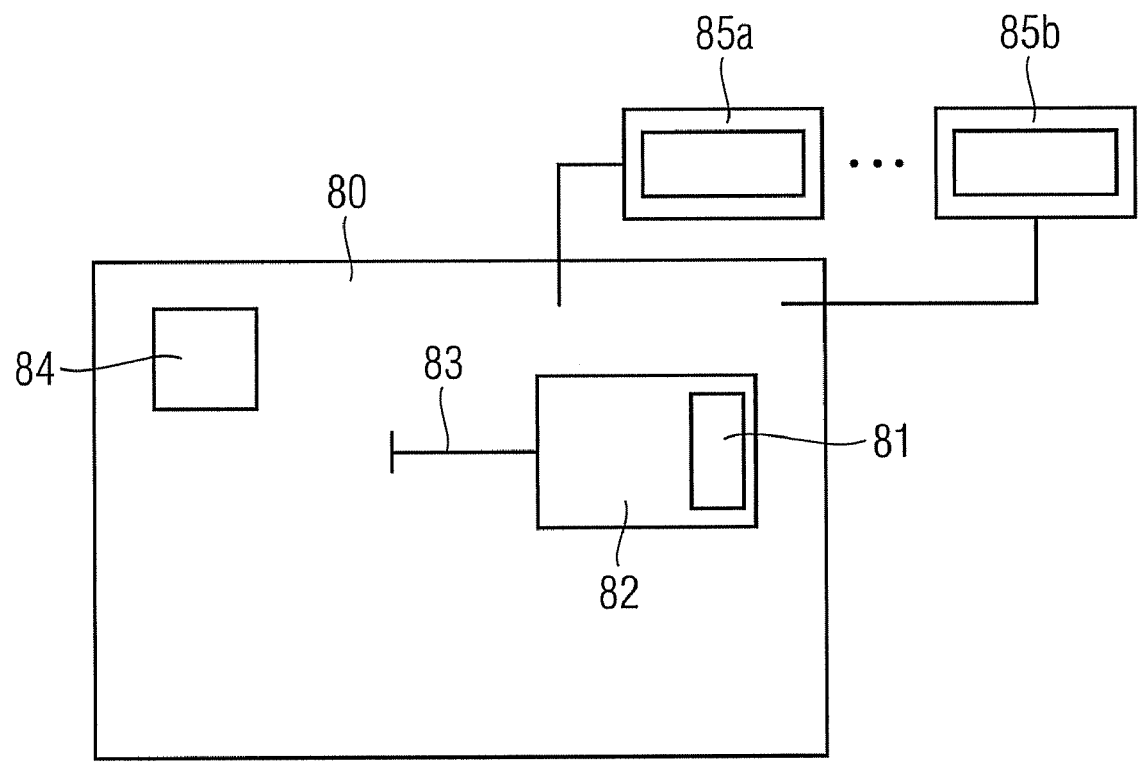
FIG. 17 illustrates an embodiment of an electronic device including an integrated circuit according to one embodiment.

FIG. 17 schematically illustrates an electronic device 80 according to an embodiment. The electronic device 80 may include an interface 83 and a component 82 which is adapted to be interfaced by the interface 83. The electronic device 80, for example the component 82, may include an integrated circuit 81 or a semiconductor chip as has been explained above. The component 82 may be connected in an arbitrary manner with the interface 83. For example, the component 82 may be externally placed and may be connected with the device 80 by the interface 83. Moreover, the component 82 may be housed inside the electronic device 80 and may be connected with the interface 83. By way of example, it is also possible that the component 82 is removably placed into a slot which is connected with the interface 83. When the component 82 is inserted into the slot, a semiconductor chip or integrated circuit 81 is interfaced by the interface 83. The electronic device 80 may further include a processing device 84 for processing data. In addition, the electronic device 80 may further include one or more display devices 85a, 85b for displaying data. The electronic device may further include components which are configured to implement a specific electronic system. Examples of the electronic system include a computer, for example, a personal computer, or a notebook, a server, a router, a game console, for example, a video game console, as a further example, a portable video game console, a graphics card, a personal digital assistant, a digital camera, a cell phone, an audio system such as any kind of music player or a video system. For example, the electronic device 80 may be a portable electronic device.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
a transistor comprising a body region formed in a first portion and a first and a second source/drain region formed in a second and a third portion, wherein the body region is formed in a semiconductor substrate;
a buried structure disposed at least below the body region;
a first and a second insulating structure comprising an insulating material and being disposed at least between the body region and regions of the second and the third portion below the first and the second source drain region, wherein the first and the second insulating structure contact the buried structure; and
wherein a lower surface of the first insulating structure and a lower surface of the second insulating structure are formed at a larger depth than an upper surface of the buried structure, the depth being measured from an upper surface of the semiconductor substrate.

2. The integrated circuit of claim 1, comprising wherein the buried structure is formed of an insulating material.

3. An integrated circuit comprising:
a transistor comprising a body region formed in a first portion and a first and a second source/drain region formed in a second and a third portion, wherein the body region is formed in a semiconductor substrate;
a buried structure disposed at least below the body region;
a first and a second insulating structure comprising an insulating material and being disposed at least between the body region and regions of the second and the third portion below the first and the second source drain region, wherein the first and the second insulating structure contact the buried structure; and
wherein the body region has a first conductivity type and wherein the buried structure is formed of a semiconductor material having a second conductivity type opposite to the first conductivity type.

4. The integrated circuit of claim 1, comprising wherein a portion of an upper surface of at least one of the first and the second insulating structure is disposed within the first or the second source/drain region, wherein a channel contact region is disposed between a surface of the semiconductor substrate adjacent to a gate insulator and the upper surface of the at least one of the first and the second insulating structure.

5. The integrated circuit of claim 1, comprising wherein a third insulating structure is disposed in the second or the third portion of the integrated circuit at least below the first or the second source/drain region such that it contacts the first or the second insulating structure.

6. The integrated circuit of claim 1, further comprising a circuitry configured to operate the transistor as a memory cell.

7. An integrated circuit comprising:
a transistor comprising a body region disposed in a semiconductor substrate and a first and a second source/drain region, the body region being disposed between the first and the second source/drain regions, wherein the body region is formed in the semiconductor substrate;
a buried structure disposed at least below the body region;
insulating structures comprising an insulating material, the insulating structures being partially disposed between the body region and the first and second source/drain regions; and wherein the body region is formed in a semiconductor substrate having a first conductivity type and wherein the buried structure is formed of a semiconductor material having a second conductivity type opposite to the first conductivity type.

8. The integrated circuit of claim 7, comprising wherein the insulating structures are disposed between the body region and portions of the integrated circuit disposed below the first and the second source/drain regions and wherein the insulating structures contact the buried structure.

9. The integrated circuit of claim 7, comprising wherein the buried structure is formed of an insulating material.

10. An integrated circuit comprising a memory device including:
   memory cells, individual ones of the memory cells comprising:
   a transistor comprising a body region disposed in a semiconductor substrate and a first and a second source/drain region, the body region being disposed between the first and the second source/drain regions, wherein the body region is formed in the semiconductor substrate;
   a buried structure disposed at least below the body region;
   insulating structures comprising an insulating material, the insulating structures being partially disposed between the body region and the first and second source/drain regions; and
   a plurality of bit lines and source lines;
   wherein the first source/drain region of an individual one of the memory cells is electrically coupled to a source line and wherein the second source/drain region of an individual one of the memory cells is electrically coupled to a bit line; and
   wherein the body region has a first conductivity type and wherein the buried structure is formed of a semiconductor material having a second conductivity type opposite to the first conductivity type.

11. The integrated circuit of claim 10, comprising wherein the insulating structures of an individual memory cell are disposed between the body region and portions of the memory cell disposed below the first and the second source/drain regions and wherein the insulating structures contact the buried structure.

12. The integrated circuit of claim 10, comprising wherein the buried structure is formed of an insulating material.

* * * * *